United States Patent
Adachi et al.

(10) Patent No.: US 9,778,428 B2
(45) Date of Patent: Oct. 3, 2017

(54) SEMICONDUCTOR OPTICAL DEVICE, ARRAYED SEMICONDUCTOR OPTICAL DEVICE, AND OPTICAL MODULE

(71) Applicant: Oclaro Japan, Inc., Kanagawa (JP)

(72) Inventors: Koichiro Adachi, Tokyo (JP); Kouji Nakahara, Tokyo (JP)

(73) Assignee: OCLARO JAPAN, INC., Kanagawa (JP)

( * ) Notice: Subject to any disclaimer, the term of this patent is extended or adjusted under 35 U.S.C. 154(b) by 0 days.

(21) Appl. No.: 15/334,317

(22) Filed: Oct. 26, 2016

(65) Prior Publication Data

US 2017/0123172 A1 May 4, 2017

(30) Foreign Application Priority Data

Oct. 29, 2015 (JP) .................. 2015-213207

(51) Int. Cl.
*G02B 6/26* (2006.01)
*G02B 6/42* (2006.01)
(Continued)

(52) U.S. Cl.
CPC ......... *G02B 6/4249* (2013.01); *G02B 6/4231* (2013.01); *G02B 6/4286* (2013.01);
(Continued)

(58) Field of Classification Search
CPC ...... H01L 2924/00; H01L 2924/00014; G02B 6/4249; G02B 6/423; G02B 6/30; G02B 6/26

See application file for complete search history.

(56) References Cited

U.S. PATENT DOCUMENTS 6,323,990 B1 * 11/2001 Yamamoto ............ H01S 5/0687
359/328
9,052,449 B2 * 6/2015 Sagawa ................. G02B 6/1223
(Continued)

FOREIGN PATENT DOCUMENTS

JP   2003-264334 A   9/2003
JP   2008-277445 A   11/2008

OTHER PUBLICATIONS

Wataru Kobayashi, et al., "Design and Fabrication of Wide Wavelength Range 25.8-Gb/s, 1.3-uM, Push-Pull-Driven DMLs", Journal of Lightwave Technology, vol. 32, No. 1, Jan. 1, 2014, p. 3-9.

*Primary Examiner* — Jennifer Doan
(74) *Attorney, Agent, or Firm* — Mattingly & Malur, PC

(57) ABSTRACT

Provided is a semiconductor optical device, an arrayed semiconductor optical device, an optical module having a structure to reduce the parasitic capacitance as well as a high design degree of freedom and having a multilayer structure in which a semi-insulating substrate, a first semiconductor layer having one conductive type, an active layer having light emission function, a second semiconductor layer having the other conductive type, an insulating layer, and a conductive layer are stacked in order from the bottom. The multilayer structure includes a light emitting structure, a first electrode structure, and a second electrode structure. In the semi-insulating substrate and the first semiconductor layer, a first grove which separates the second electrode structure from a remaining portion and approaches the second electrode structure with a non-linear shape rather than a linear shape in its entirety is formed.

13 Claims, 22 Drawing Sheets

(51) Int. Cl.
*H01S 5/125* (2006.01)
*H01S 5/22* (2006.01)
*H01S 5/343* (2006.01)
*H01S 5/40* (2006.01)

(52) U.S. Cl.
CPC .............. *H01S 5/125* (2013.01); *H01S 5/22* (2013.01); *H01S 5/343* (2013.01); *H01S 5/4025* (2013.01)

(56) References Cited

U.S. PATENT DOCUMENTS

2003/0169796 A1  9/2003  Nakamura et al.
2008/0266638 A1  10/2008  Shinoda et al.

\* cited by examiner

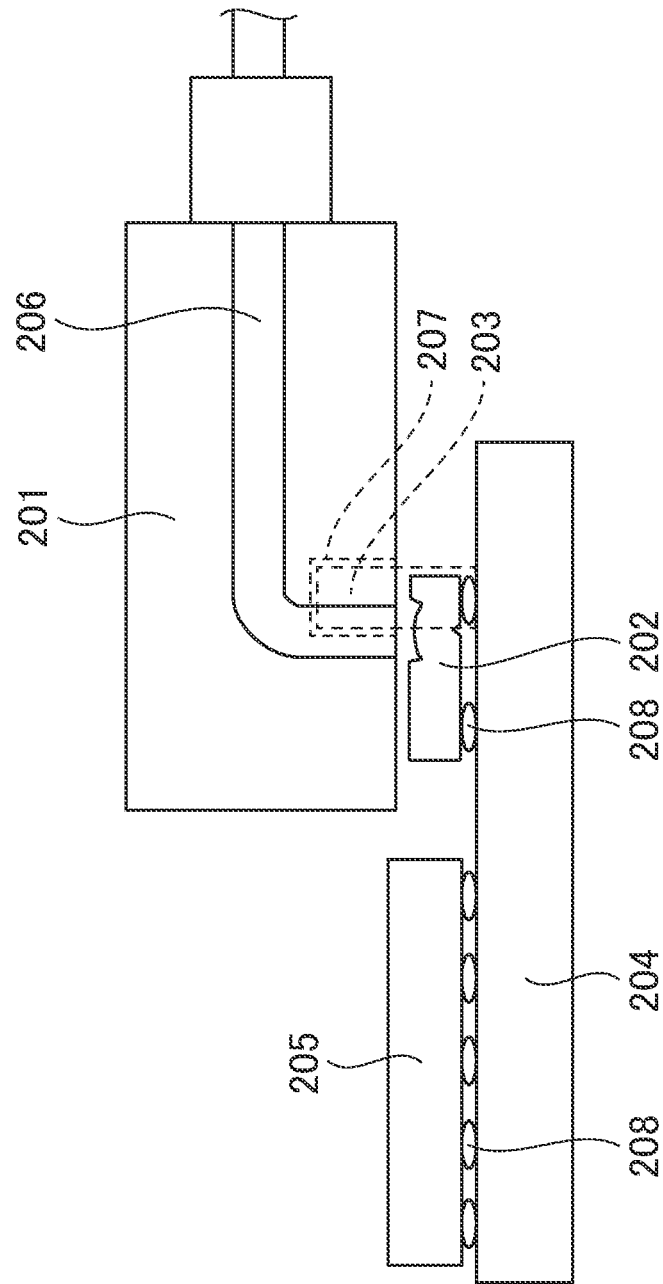

SEMICONDUCTOR OPTICAL DEVICE, ARRAYED SEMICONDUCTOR OPTICAL DEVICE, AND OPTICAL MODULE

CROSS-REFERENCE TO RELATED APPLICATION

The present application claims priority from Japanese application JP 2015-213207, filed on Oct. 29, 2015, the content of which is hereby incorporated by reference into this application.

BACKGROUND OF THE INVENTION

1. Field of the Invention

The present invention is related to a semiconductor optical device, an arrayed semiconductor optical device, and an optical module, in particular, to reduction in parasitic capacitance of the semiconductor optical device.

2. Description of the Related Art

A semiconductor optical device having a one-side electrode structure in which one pair of electrodes is arranged on one surface of a substrate is used. A higher speed operation is required for the semiconductor optical device and thus, the parasitic capacitance of the semiconductor optical device needs to be reduced.

SUMMARY OF THE INVENTION

In "Design and Fabrication of Wide Wavelength Range 25.8-Gb/S, 1.3-μM, Push-Pull-Driven DMLs", IEEE Journal of Lightwave Technology, vol. 32, No. 1, Pages 3-9, Jan. 1, 2014, W. Kobayashi, et al, a ridge waveguide type direct modulation laser with a one-side electrode structure is disclosed. The p-electrode part is buried with a thick benzocyclobutene (BCB) film in order to reduce parasitic capacitance of a chip and a p-electrode pad is arranged on the BCB.

However, in a case where an organic layer with a thick film such as the BCB is formed, it is not easy to control a film thickness of the organic layer. As a result, a large level difference (approximately 5 μm) between the upper surface of an n-type contact layer and the upper surface of a p-type contact layer occurs. In order to achieve sufficient decrease of capacitance, in general, a thickness of at least 1 μm to 3 μm is required for the organic layer and there is concern that deterioration of yield in the manufacturing process, for example, occurrence of disconnection of electrode due to the level difference, occurs. Irregularity, for example, swelling of a portion of the surface of the substrate, may be generated. As a result, it is difficult to connect the p-electrode and the n-electrode respectively to electrode portions of the mounted substrate in a satisfactory state and reduction of yield or reliability may be caused from the viewpoint of mounting.

In JP 2003-264334 A, a ridge waveguide type semiconductor laser device with a one-side electrode structure is disclosed (see FIG. 1). In order to attain a low capacity structure, a first separation groove 31 and a second separation groove 32 are respectively formed on one side and the other side of a portion including a ridge 16 and grooves 15 of both sides. An anode electrode 25 (p-electrode) contacts the upper surface of the ridge 16 and extends to the upper surface of the flat surface 35 over the second separation groove 32. The second separation groove 32 is formed in a portion extending from the front end surface to the rear end surface in the depth direction (length direction) by etching and is provided to extend from the p-InGaAs layer 9 of the uppermost layer to a depth on the way of the semiconductor substrate 2 over the active layer 6 and the Fe—InP layer 3. The second separation groove 32 is linearly formed from the front end surface to the rear end surface in its entirety to thereby make it possible to secure the electrode pad in a wide range, but, on the contrary, a degree of freedom of designing a device becomes smaller.

The present invention intends to solve the problem described above and an object of the present invention is to provide a semiconductor optical device, an arrayed semiconductor optical device, and an optical module having a structure to reduce the parasitic capacitance as well as a high design degree of freedom.

(1) In order to solve the problem described above, according to the present invention, there is provided a semiconductor optical device including a multilayer structure in which a semi-insulating substrate, a first semiconductor layer having one of p-type conductivity and n-type conductivity, an active layer having light emission function, a second semiconductor layer of having conductivity opposite to that of the first semiconductor layer, an insulating layer, and an conductive layer are stacked in order from the bottom. The multilayer structure includes a light emitting structure, a first electrode structure, and a second electrode structure. In the semi-insulating substrate and the first semiconductor layer, a first groove, which separates the second electrode structure from a remaining portion and approaches the second electrode structure with a non-linear shape rather than a linear shape in its entirety, is formed; in the first semiconductor layer, the remaining portion separated by the first groove continues from the light emitting structure to the first electrode structure; the active layers is formed on each of the light emitting structure, the first electrode structure, and the second electrode structure to be separated; the second semiconductor layer is formed on each of the light emitting structure, the first electrode structure, and the second electrode to be separated; the insulating layer is formed to cover the first semiconductor layer and expose a portion of the second semiconductor layer in the light emitting structure, cover the second semiconductor layer in the first electrode structure, cover the first semiconductor layer and the second semiconductor layer in the second electrode structure, and cover the first semiconductor layer in the inner surface of the first groove; and the conductive layer includes a first wiring pattern contacting the first semiconductor layer and reaching the upper end of the first electrode structure and a second wiring pattern contacting the second semiconductor layer in the light emitting structure and reaching the upper end of the second electrode structure through above the insulating layer in the inner side of the first groove.

(2) In the semiconductor optical device described in (1), the light emitting structure may include a ridge configured by a portion of the second semiconductor layer.

(3) In the semiconductor optical device described in (1) or (2), the insulating layer may be formed to expose a portion of the first semiconductor layer between the light emitting structure and the first electrode structure and the first wiring pattern may contact the first semiconductor layer to be electrically connected between the light emitting structure and the first electrode structure.

(4) In the semiconductor optical device described in any one of (1) to (3), the light emitting structure may further include a diffraction grating and may be configured as a distributed feedback laser.

(5) In the semiconductor optical device described in any one of (1) to (3), the light emitting structure may further include a distributed Bragg reflection mirror and may be configured as a distributed Bragg reflector type laser.

(6) In the semiconductor optical device described in any one of (1) to (3), the light emitting structure may further include a distributed feedback laser and a distributed Bragg reflection mirror, and may be configured as a distributed reflector type laser.

(7) In the semiconductor optical device described in any one of (1) to (6), mirror structures in which light emitted from the light emitting structure is reflected toward a side opposite to the conductor layer may be monolithically integrated.

(8) In the semiconductor optical device described in any one of (1) to (7), the semi-insulating substrate and the first semiconductor layer may have a side surface enlarging in a thickness direction, and at one end of the first groove may be formed to be opened to the side surface of the semi-insulating substrate and the first semiconductor layer.

(9) According to the present invention, there is provided an arrayed semiconductor optical device including a plurality of semiconductor optical devices, in which each of the plurality of semiconductor optical devices is the semiconductor optical device described in anyone of (1) to (7), the plurality of semiconductor optical devices are monolithically integrated, and a second groove separating adjacent semiconductor optical devices may also be formed in the semi-insulating substrate and the first semiconductor layer.

(10) In the arrayed semiconductor optical device according described in (9), at least one end of the first groove formed on one of the adjacent semiconductor optical devices may be formed to be opened to the second groove.

(11) According to the present invention, there is provided an optical module including the semiconductor optical device described in any one of (1) to (8), a drive circuit for driving the semiconductor optical device, an external waveguide optically connected to the semiconductor optical device, and a package for fixing the semiconductor optical device, the drive circuit, and the external waveguide to predetermined positions, respectively.

(12) According to the present invention, there is provided an optical module including the arrayed semiconductor optical device described in (9) or (10), a drive circuit for driving the plurality of semiconductor optical devices, a plurality of external waveguides optically connected respectively to the plurality of semiconductor optical devices, and a package for fixing the plurality of semiconductor optical devices, the drive circuit, and the plurality of external waveguides to predetermined positions, respectively.

According to the present invention, a semiconductor optical device, an arrayed semiconductor optical device, and an optical module having a structure to reduce the parasitic capacitance as well as a high design degree of freedom are provided.

BRIEF DESCRIPTION OF THE DRAWINGS

FIG. 7B is a side view of the optical module according to the sixth embodiment of the present invention.

DETAILED DESCRIPTION OF THE INVENTION

Figure 1A:
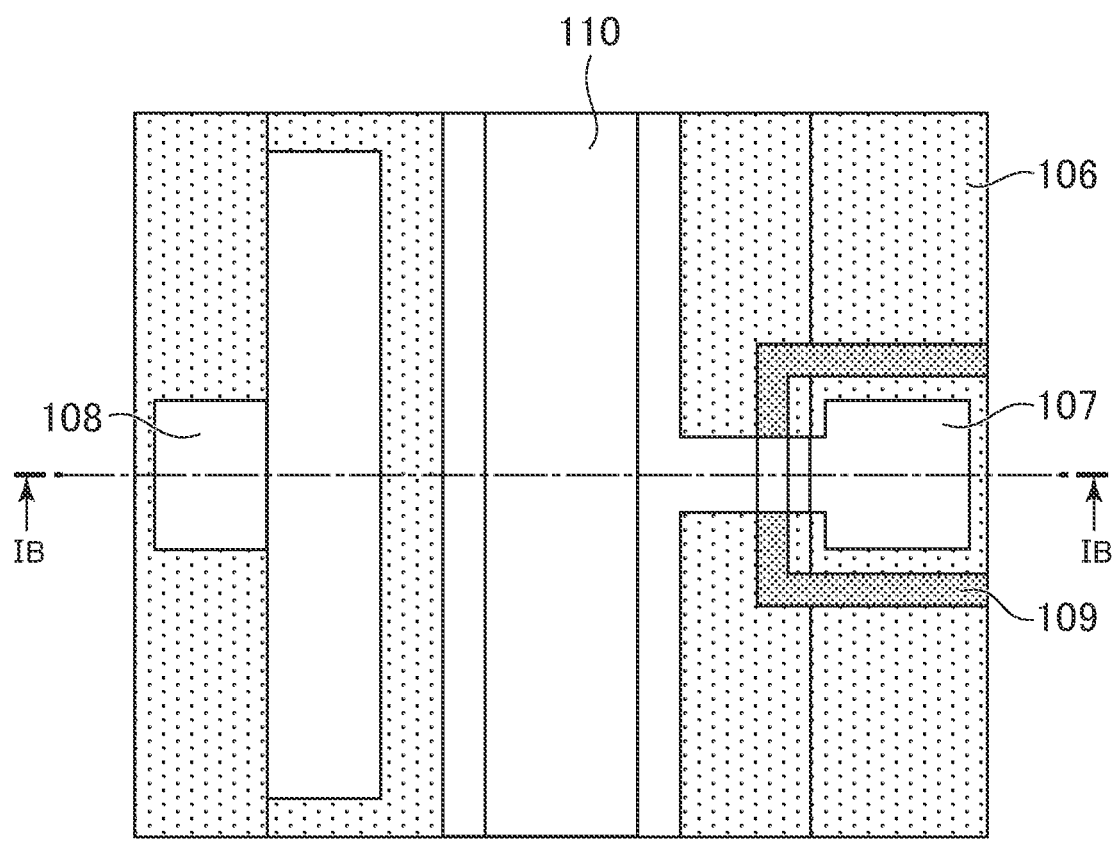
FIG. 1A is a plan view of a semiconductor optical device according to a first embodiment of the present invention.

In the following, embodiments of the present invention will be specifically described based on the drawings. In all drawings for describing the embodiments, members equipped with the same functions are denoted by the same reference numerals and descriptions thereof will not be repeated. The drawings illustrated in the following are ultimately for describing embodied example of the embodiments and thus, a size or scale of drawings described in the embodied example does not necessarily correspond to an actual size.

First Embodiment

FIG. 1A is a plan view of a semiconductor optical device according to a first embodiment of the present invention.

The semiconductor optical device according to the first embodiment is a ridge waveguide type distributed feedback (DFB) laser of a 1.3 μm wavelength band and includes a one-side electrode structure in which a p-side electrode 107 and an n-side electrode 108 are arranged on one side (here, upper surface) of a substrate. A side surface existing on the upper end (upper side) of the semiconductor optical device of FIG. 1A corresponds to a front end surface and the semiconductor optical device emits light from the front end surface. The lower end (lower side) corresponds to a rear end surface.

Figure 1B:
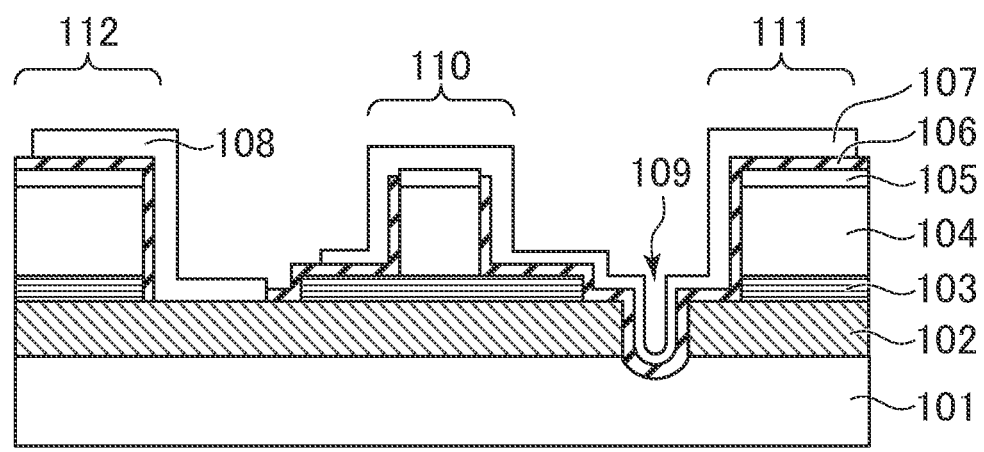
FIG. 1B is a sectional view of the semiconductor optical device according to the first embodiment of the present invention.

FIG. 1B is a sectional view of the semiconductor optical device according to the first embodiment of the present invention and illustrates a section taken along the line IB-IB illustrated in FIG. 1A. As illustrated in FIG. 1B, the semiconductor optical device has a multilayer structure. The multilayer structure has a structure in which a semi-insulating InP substrate 101, an n-type InP layer 102, an InGaAlAs based active layer 103, a p-type semiconductor layer, an SiO$_2$ protection film 106, and a conductive layer are stacked in order from the bottom.

The semi-insulating InP substrate 101 is a semi-insulating substrate and made of InP doped with Fe. A substrate according to the first embodiment is not limited thereto as long as the substrate has small electrical conductivity (high electrical resistance) capable of being regarded as semi-insulating property. The n-type InP layer 102 is a first semiconductor layer and here, has an n-type conductivity, but may have one of the p-type and n-type conductivity. The InGaAlAs based active layer 103 is an active layer having light emission function and in which gain occurs through current injection. The InGaAlAs based active layer 103 includes a multi-quantum well structure in which well layers and barrier layers, which are InGaAlAs based layers, are alternately stacked on each other plural times, and a composition wavelength of the quantum well is 1.31 μm. The p-type semiconductor layer is a second semiconductor layer having the p-type and a conductive type of the second semiconductor layer is opposite to that of the first semiconductor layer. The p-type semiconductor layer includes a p-type etching stop layer (not illustrated), a p-type InP layer 104, and a p-type InGaAs contact layer 105. The SiO$_2$ protection film 106 is an insulating layer. The conductive layer includes the p-side electrode 107 and the n-side electrode 108. The semiconductor layer of the semiconductor optical device is constituted with the semi-insulating InP substrate 101, the n-type InP layer 102, the InGaAlAs based active layer 103, and a p-type semiconductor layer.

The multilayer structure includes a light emitting structure, a first electrode structure, and a second electrode structure. In the semiconductor optical device according to the first embodiment, the InGaAlAs based active layer 103 and a ridge formed above the InGaAlAs based active layer 103 to have a predetermined width are arranged. Among the InGaAlAs based active layer 103, a waveguide is formed at a portion located below the ridge and light is emitted from the waveguide. That is, the portion where the ridge is formed among the multilayer structure corresponds to the light emitting structure. The light emitting structure has the ridge. An extending direction of the ridge is [110] or [1-10] orientation of the semi-insulating InP substrate 101 and here, corresponds to the up/down direction of FIG. 1A. The light emitting structure is denoted as a light emitting part 110 in FIG. 1A and FIG. 1B. The ridge extends from the front end surface to the rear end surface and the emission direction of light coincides with the extension direction of the ridge. A resonator length (length from front end surface to rear end surface) is 150 μm.

Banks (bank part) are arranged on both sides of the ridge, one of the banks is a first electrode structure (n-side electrode structure) and the other one is a second electrode structure (p-side electrode structure). The first electrode structure corresponds to a portion where the n-side electrode 108 is formed on the upper surface of the one bank and denoted by an n-type electrode formation part 112 in the figure. The second electrode structure corresponds to a portion where the p-side electrode 107 is formed on the upper surface of the other one bank and denoted by a p-type electrode formation part 111 in the figure. Among the p-side electrode 107, a portion where the p-type electrode formation part 111 (second electrode structure) is formed is a pad part for wire bonding.

The major characteristics of the semiconductor optical device according to the first embodiment is that a separation groove 109 (first groove) is arranged to surround the p-type electrode formation part 111 (pad part of p-side electrode 107). As illustrated in FIG. 1B, a depth (lowest point along thickness direction (stacking direction)) of the separation groove 109 reaches the semi-insulating InP substrate 101. That is, the separation groove 109 is a groove formed on the semi-insulating InP substrate 101 and the n-type InP layer 102, and separates the p-type electrode formation part 111 (second electrode structure) from the remaining portion.

The separation groove 109 extends from the side surface (right end of FIG. 1A) of the semiconductor optical along the upper side of FIG. 1A of the pad part in a direction (left direction of FIG. 1A) perpendicular to the extending direction of the ridge at the front side of the pad part of the p-side electrode 107, is bent, extends along the left side of FIG. 1A of the pad part in the extending direction (down direction of FIG. 1A), is further bent, extends along the lower side (right direction of FIG. 1A) of FIG. 1A of the pad part, and extends to the side surface of the semiconductor optical device. That is, the separation groove 109 is a groove which separates the pad part of the p-side electrode 107 from the remaining portion and approaches the pad part with a non-linear shape rather than a linear shape in its entirety when viewed from top.

The side surface of the semiconductor device is also formed on the semi-insulating InP substrate 101 and the n-type InP layer 102 and thus, the semi-insulating InP substrate 101 and the n-type InP layer 102 includes the side surface enlarging in the thickness direction (stacking direction). Both ends of the separation groove 109 are formed to be opened to the side surface of the semiconductor device. In the present specification, the side surface is a surface extending in the thickness direction (stacking direction) between a front end surface where light is emitted from the semiconductor optical device and a rear end surface located at a side opposite to the front end surface. The side surface does not include the upper surface and lower surface of a device, the front end surface, and the rear end surface.

In the n-type InP layer 102 (first semiconductor layer), the p-type electrode formation part 111 (second electrode structure) is separated from the remaining portion by the separation groove 109 (first groove) and the remaining portion is continued from the light emitting part 110 (light emitting structure) to the n-type electrode formation part 112 (first electrode structure).

The InGaAlAs based active layer 103 (active layer) is formed on each of the light emitting structure, the first electrode structure and the second electrode structure to be separated.

The p-type semiconductor layer (second semiconductor layer) is formed on each of the light emitting structure, the first electrode structure, and the second electrode structure to be separated.

The $SiO_2$ protection film 106 (insulating layer) is formed to cover the n-type InP layer 102 (first semiconductor layer) and expose a portion of the p-type semiconductor layer (second semiconductor layer) in the light emitting part 110 (light emitting structure). The $SiO_2$ protection film 106 is formed to cover the p-type semiconductor layer (second semiconductor layer) in the n-type electrode formation part 112 (first electrode structure). The $SiO_2$ protection film 106 is formed to cover the n-type InP layer 102 and the p-type semiconductor layer in the p-type electrode formation part 111 (second electrode structure) and formed to cover the n-type InP layer 102 in the inner surface of the separation groove 109. The $SiO_2$ protection film 106 is formed to expose a portion of the n-type InP layer 102 between the light emitting part 110 and the n-type electrode formation part 112. In the first embodiment, the $SiO_2$ protection film 106 is formed on the entire upper surface of the device except for an area (at least a portion) of the upper surface of the ridge and (a portion of) a flat area between the ridge and the bank of the n-side electrode 108 side.

In FIG. 1A, half-tone dot meshing is applied in the surface (upper surface) of the semiconductor optical device in order to clarify an area in which the $SiO_2$ protection film 106 is formed. Among the area in which the separation groove 109 is formed, another half-tone dot meshing is applied in an area in which the $SiO_2$ protection film 106 is exposed.

The n-side electrode 108 is a first wiring pattern contacting the n-type InP layer 102 and reaching the upper end of the n-type electrode formation part 112. In the first embodiment, the $SiO_2$ protection film 106 is not formed between the light emitting part 110 and the n-type electrode formation part 112 and the n-side electrode 108 contacts the n-type InP layer 102 to be electrically connected in a portion where the n-type InP layer 102 is exposed. An area for connecting the n-side electrode 108 and the n-type InP layer 102 is arranged in the vicinity of the light emitting part 110 to thereby make it possible to shorten the current path between the n-side electrode 108 and the n-type InP layer 102 and reduce the electrical resistance of a device.

The p-side electrode 107 is a second wiring pattern contacting the p-type semiconductor layer on the light emitting part 110 and reaching the upper end of the p-type electrode formation part 111 through above the $SiO_2$ protection film 106 in the inner side of the separation groove 109 (first groove). In the first embodiment, the uppermost layer of the p-type semiconductor layer is the p-type InGaAs contact layer 105 and the p-side electrode 107 contacts the p-type InGaAs contact layer 105 in a portion where the $SiO_2$ protection film 106 is not formed in the upper surface of ridge.

As illustrated in FIG. 1A, the p-side electrode 107 includes a portion formed on the upper surface of the ridge of the light emitting part 110 and both side surfaces, a pad part formed on the p-type electrode formation part 111, and a connection part connecting the light emitting part 110 and the p-type electrode formation part 11. The connection part of the p-side electrode 107 extends across the separation groove 109 in the left-right direction of FIG. 1A in a portion where the separation groove 109 extends along the extending direction of the ridge.

As illustrated in FIG. 1A, the n-side electrode 108 includes a portion contacting the n-type InP layer 102, a portion formed on the n-type electrode formation part 112, and a connection part connecting both portions in a flat area located between the light emitting part 110 and the n-type electrode formation part 112.

In the semiconductor optical device according to the first embodiment, the n-type InP layer 102 is separated into the second electrode structure and the remaining portion by the separation groove 109. The second electrode structure is electrically separated from the remaining portion of the semiconductor layer and is structured to reduce the parasitic capacitance. The semi-insulating InP substrate 101 continues with the second electrode structure and the remaining portion. However, the resistivity of the semi-insulating InP substrate 101 is high and the semi-insulating InP substrate 101 is regarded as being electrically separated in the present specification.

The separation groove 109 approaches the second electrode structure with a non-linear shape rather than a linear shape in its entirety and thus, is able to be formed by avoiding other structures. Therefore, it is possible to enlarge an area to be provided for other structures and implement higher degree of freedom of designing. Here, both ends of the separation groove 109 are formed to be opened to the side surface of the semiconductor device and other optical components may be arranged in the front and rear of the second electrode structure and higher design degree of freedom may be implemented. In the first embodiment, both ends of the separation groove 109 are formed to be opened to the side surface of the semiconductor device, but the structure of the separation groove 109 is not limited thereto. At least one end may be formed to be opened to the side surface. In this case, one end of the separation groove 109 is opened to the side surface and the other end is opened to the front end surface or the rear end surface. However, a high design degree of freedom may be implemented in the side where the one end is opened to the side surface. In the first embodiment, the separation groove 109 has a shape obtained by combining straight lines but is not limited thereto, and may have a shape obtained by including a curved line.

Descriptions have been made on the semiconductor optical device according to the first embodiment. In the following, a manufacturing method of the semiconductor optical device according to the first embodiment will be described. FIG. 2A to FIG. 2H are sectional views illustrating the manufacturing processes of the semiconductor optical device according to the first embodiment and corresponds to sections when taken along the line IB-IB of FIG. 1A.

Figure 2A:
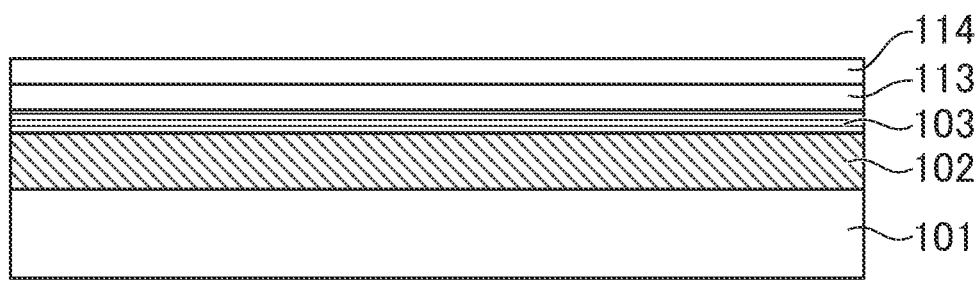
FIG. 2A is a sectional view illustrating a manufacturing process of the semiconductor optical device according to the first embodiment of the present invention.

First, on a wafer made of the semi-insulating InP substrate 101, the n-type InP layer 102, the InGaAlAs based active layer 103, the p-type etching stop layer (not illustrated), a p-type InP spacer layer 113, and a p-type InGaAsP diffraction grating layer 114 are sequentially subjected to epitaxial growth using an organic metal vapor deposition method or the like (FIG. 2A). The p-type etching stop layer is stacked for etching by which the ridge is formed.

The InGaAlAs based active layer 103 includes an n-side optical confinement layer made of n-type InGaAlAs, a p-side optical confinement layer made of p-type InGaAlAs, and a multi-quantum well structure arranged between the n-side and p-side optical confinement layers. Here, the multi-quantum well structure is obtained by stacking a well layer having a thickness of 7 nm and a barrier layer having a thickness of 8 nm at eight periods, and the well layer and the barrier layer are made of undoped InGaAlAs. The multi-quantum well structure is designed such that emitted light output is able to implement sufficient characteristics.

Figure 2B:
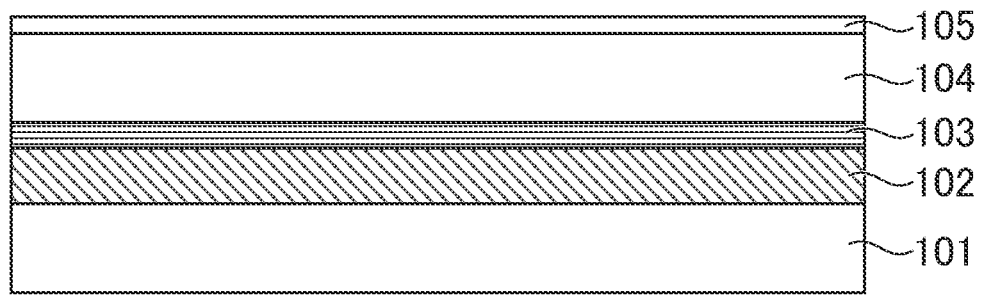
FIG. 2B is another sectional view illustrating the manufacturing process of the semiconductor optical device according to the first embodiment of the present invention.

Next, the p-type InGaAsP diffraction grating layer 114 is subjected to electron beam exposure to form a diffraction grating having uniform pitches along the extending direction (a direction penetrating the paper surface of FIG. 2A forwardly and rearwardly) of the ridge. The structure of the diffraction grating is formed to have an oscillation wavelength of the DFB laser of 1.31 µm at room temperature. Thereafter, the wafer is introduced into a growth furnace again and the p-type InP layer 104 and the p-type InGaAs contact layer 105 are stacked on the entire surface of the wafer (FIG. 2B). The section illustrated in FIG. 2B corresponds to a portion where the diffraction grating is not formed and thus, the diffraction grating is not illustrated in FIG. 2B. In FIG. 2B, the p-type InP spacer layer 113 is illustrated as being integrally formed with the p-type InP layer 104 and in particular, the p-type InP spacer layer 113 is not formed as a layer separated from the p-type InP layer 104. The p-type InGaAs contact layer 105 has a carrier concentration of $10^{18}$ cm$^{-3}$ by doping.

In the first embodiment, the diffraction grating is uniformly formed in the entire area of the semiconductor optical device (DFB laser) but is not limited thereto, and may have the so-called phase shift structure in which a phase of diffraction grating is deviated at a portion of an area above the InGaAlAs based active layer 103. The diffraction grating may also have a structure in which a period of a diffraction grating is changed along an optical axis of light.

Figure 2C:
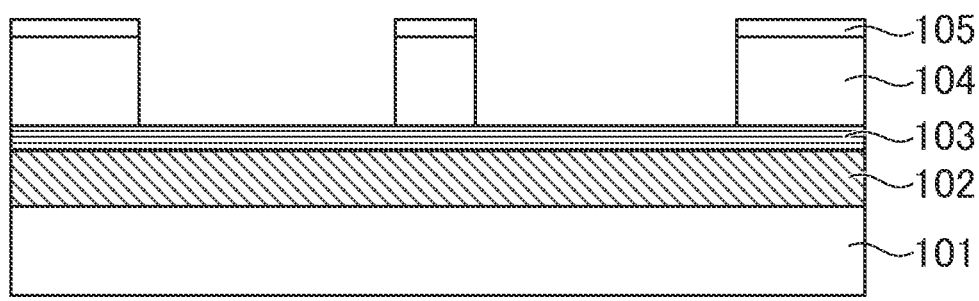
FIG. 2C is another sectional view illustrating the manufacturing process of the semiconductor optical device according to the first embodiment of the present invention.

Subsequently, on the wafer, the SiO$_2$ film (silicon dioxide film) is covered to be a predetermined shape and a protective mask is formed. A portion of the p-type InP layer 104 and the p-type InGaAs contact layer 105 is removed using the protective mask and a ridge and banks (bank part) at both sides of the ridge spaced apart by a predetermined distance are formed (FIG. 2C). Through subsequent processes, the ridge becomes the light emitting part 110 and the banks at the both sides become the n-type electrode formation part 112 and the p-type electrode formation part 111, respectively.

Figure 2D:
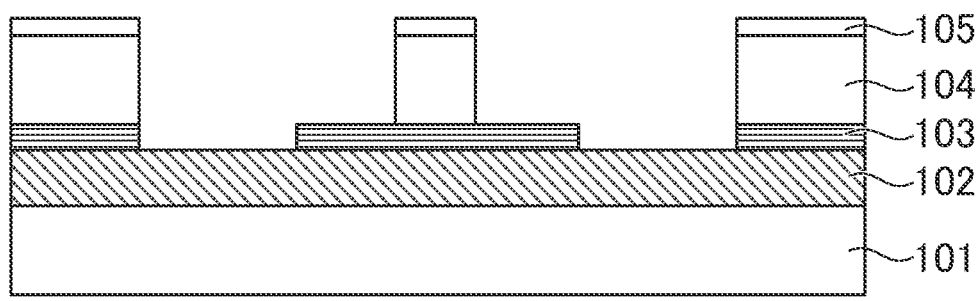
FIG. 2D is another sectional view illustrating the manufacturing process of the semiconductor optical device according to the first embodiment of the present invention.

Subsequently, a portion of the InGaAlAs based active layer 103 is removed by a photolithography method and wet etching (FIG. 2D). The area in which the InGaAlAs based active layer 103 is removed includes an area where the n-side electrode 108 contacts the n-type InP layer 102, and from the viewpoint that the electrical resistance of the device is reduced, the area is arranged between the ridge and the bank of the n-side electrode 108 side. Here, the area in which the InGaAlAs based active layer 103 is removed is defined as an area obtained by excluding an area spreading from the ridge to both sides by a predetermined distance from the area between the ridge and the bank.

Figure 2E:
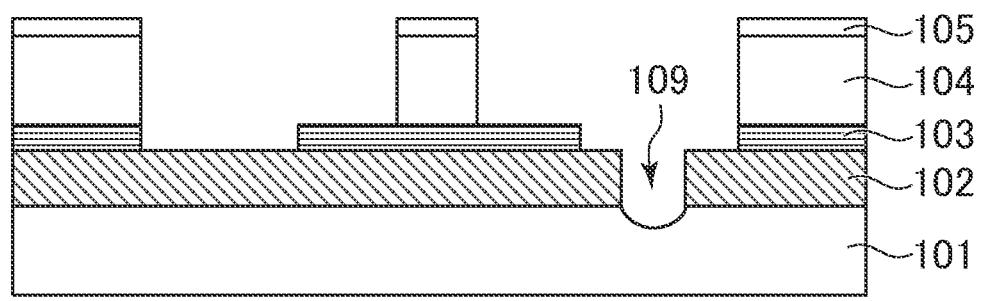
FIG. 2E is another sectional view illustrating the manufacturing process of the semiconductor optical device according to the first embodiment of the present invention.

Next, the separation groove 109 is formed using the photolithography method and the wet etching of the hydrogen bromide system (FIG. 2E). The depth of the separation groove 109 is adjusted to reach the semi-insulating InP substrate 101.

Figure 2F:
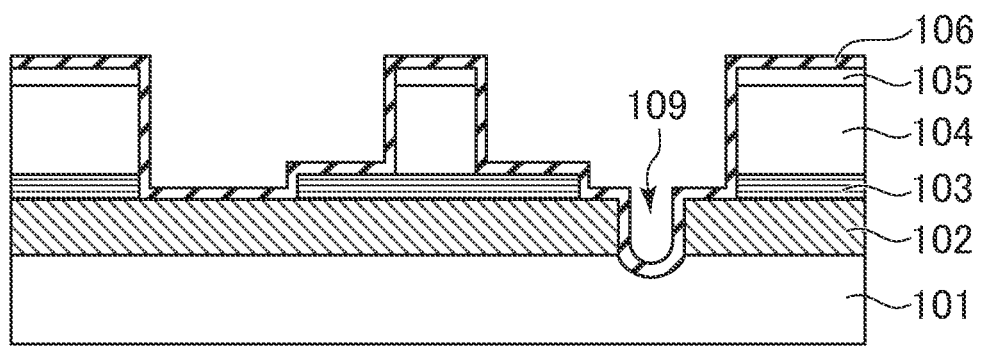
FIG. 2F is another sectional view illustrating the manufacturing process of the semiconductor optical device according to the first embodiment of the present invention.
Figure 2G:
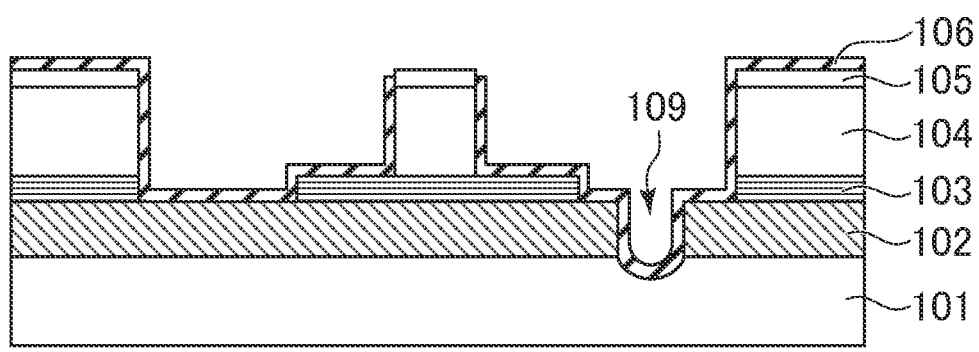
FIG. 2G is another sectional view illustrating the manufacturing process of the semiconductor optical device according to the first embodiment of the present invention.

Thereafter, the SiO$_2$ protection film 106 is formed on the entire surface of the wafer (FIG. 2F). The SiO$_2$ protection film 106 arranged on the upper surface of the p-type InGaAs contact layer 105, which is located on the uppermost layer of the ridge, is removed (FIG. 2G).

Figure 2H:
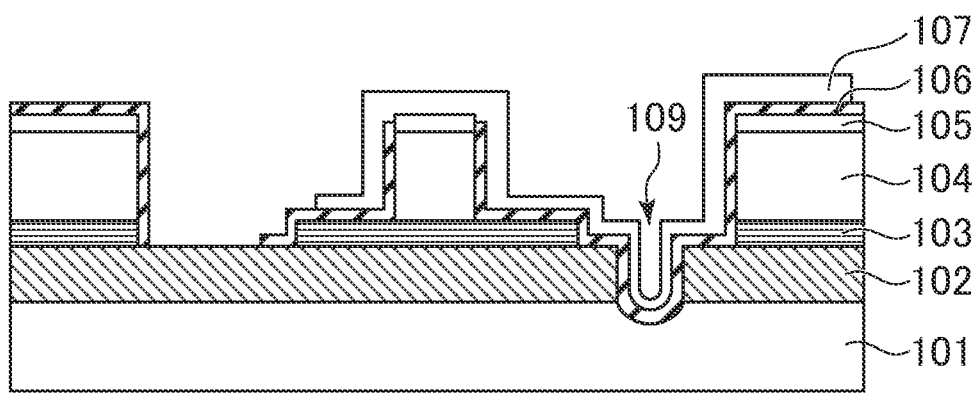
FIG. 2H is another sectional view illustrating the manufacturing process of the semiconductor optical device according to the first embodiment of the present invention.

The SiO$_2$ protection film 106 arranged on the area where the n-side electrode 108 contacts the n-type InP layer 102 is removed. The p-side electrode 107 is deposited in a predetermined shape (FIG. 2H). The predetermined shape of the p-side electrode 107 is a shape in which the p-side electrode 107 contacts the p-type InGaAs contact layer 105 in the upper surface of the ridge, extends on the separation groove 109, and reaches the upper end of the p-type electrode formation part 111.

Next, the n-side electrode 108 is deposited in a predetermined shape. The predetermined shape of the n-side electrode 108 is a shape which includes an area contacting the n-type InP layer 102 located between the ridge and the bank and in which the n-side electrode 108 reaches the upper end of the n-type electrode formation part 112.

Thereafter, the rear surface of the wafer is polished to reach a thickness of 100 µm. As described above, a wafer process is completed. Furthermore, a chip is cut out by cleaving a wafer and an antireflection dielectric film is formed on the front end surface (cleavage end surface of light emission side) of the semiconductor optical device and a high reflection dielectric film is formed on the rear end surface to manufacture the semiconductor optical device (FIG. 1B).

The semiconductor optical device manufactured by the manufacturing process described above is mounted on a sub-mount by junction down mounting. The semiconductor optical device according to the first embodiment has the same stacked structure as the first electrode structure and the second electrode structure, a height difference between the n-type electrode formation part 112 and the p-type electrode formation part 111 is reduced, and the upper surfaces are substantially the same surface (same height). Accordingly, when the semiconductor optical device is mounted on the sub-mount, inclination of the semiconductor device may be reduced, the solder connection failure may be suppressed, and thus, stable mounting may be implemented.

The oscillation characteristic of the semiconductor optical device according to the first embodiment is evaluated. The oscillation threshold current is 7 mA and the slope efficiency is 0.3 W/A at room temperature and a good single wavelength oscillation having a sub-mode suppression ratio of 40 dB or more is obtained. These evaluation results correspond to good results which are equivalent to those of the DFB laser having the same resonator structure but not having the separation groove. That is, degradation of the oscillation characteristic due to provision of the separation groove is significantly suppressed. When the capacitance of a device of the semiconductor optical device is measured, it is found out that a low value of 0.5 pF is able to be obtained, the decrease of capacitance is implemented, the semiconductor optical device according to the first embodiment achieves the remarkable effect.

A communication quantity in the data center is increased with the spread of cloud computing. In order to cope with the increase of the communication quantity, next generation 100 GbE standardization for interconnects between data centers and next generation 400 GbE standardization for achievement of larger capacity are being progressed. The optical transceivers for 100 GbE and 400 GbE adopt a multichannel scheme. Further speeding up is also requested for a speed per channel than the conventional 10 Gbps. For example, 25 Gbps×4-channels and 50 Gbps×8 channels in 100 GbE and 400 GbE have been proposed, respectively. On the other hand, one of the significant problems to be solved is to reduce the operation cost in the data center as the communication quantity is increased and thus, miniaturization cost reduction and reduction of power consumption is also heavily requested for the optical module used in data transmission and reception. The semiconductor optical device according to the first embodiment is most suitable for the semiconductor optical device provided in an optical module used for optical communication.

The semiconductor optical device according to the first embodiment is an InGaAlAs quantum well type laser having the wavelength band of 1.3 μm and formed on the InP substrate. However, substrate materials or active layer materials and the oscillation wavelength are not limited to the first embodiment. For example, the present invention may also be applied to the semiconductor laser of different substrate materials or different active layer materials, having different oscillation wavelengths, such as the semiconductor laser having the wavelength band of 1.55 μm and the semiconductor laser having InGaAsP-based quantum well.

Second Embodiment

Figure 3A:
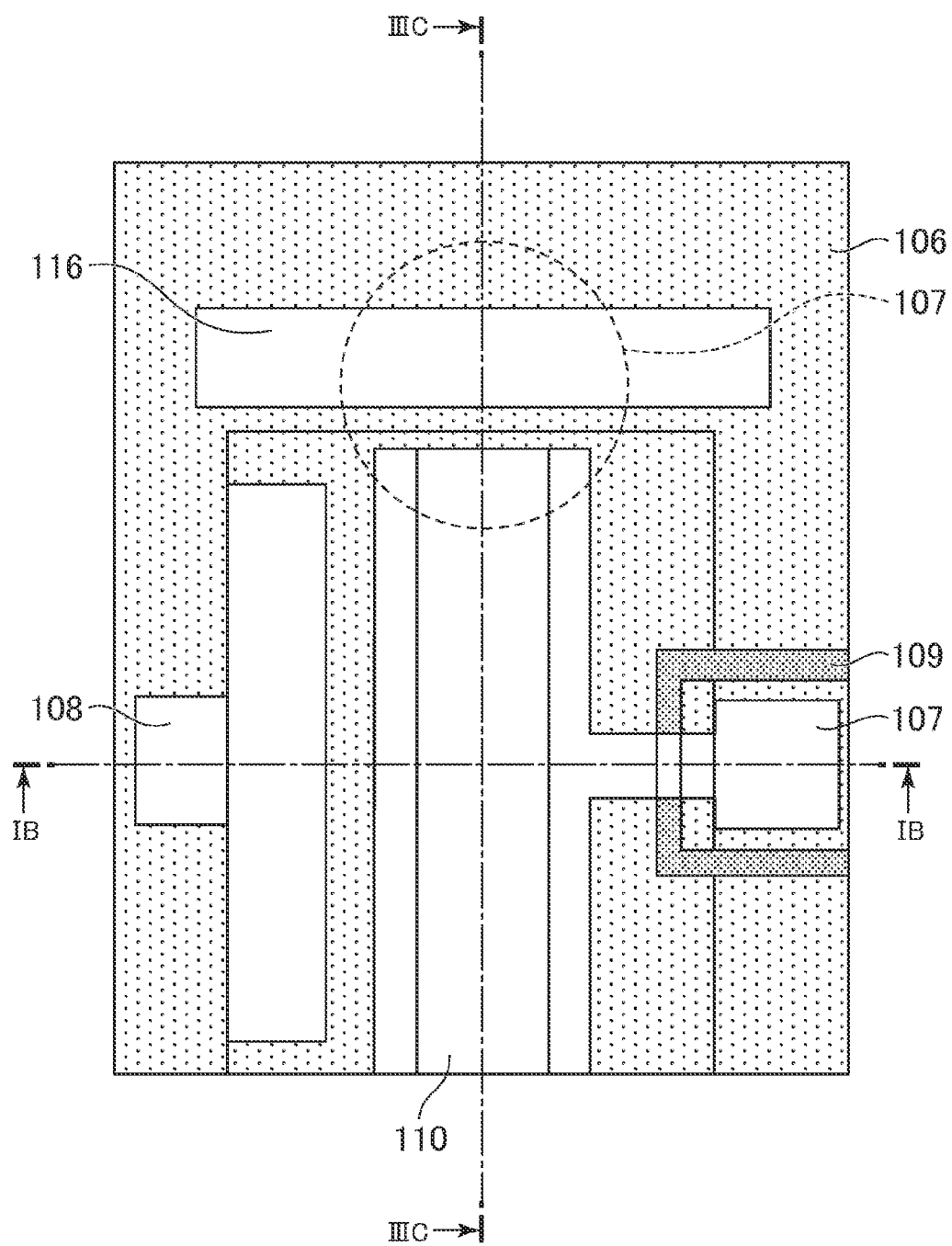
FIG. 3A is a plan view of a semiconductor optical device according to a second embodiment of the present invention.
Figure 3B:
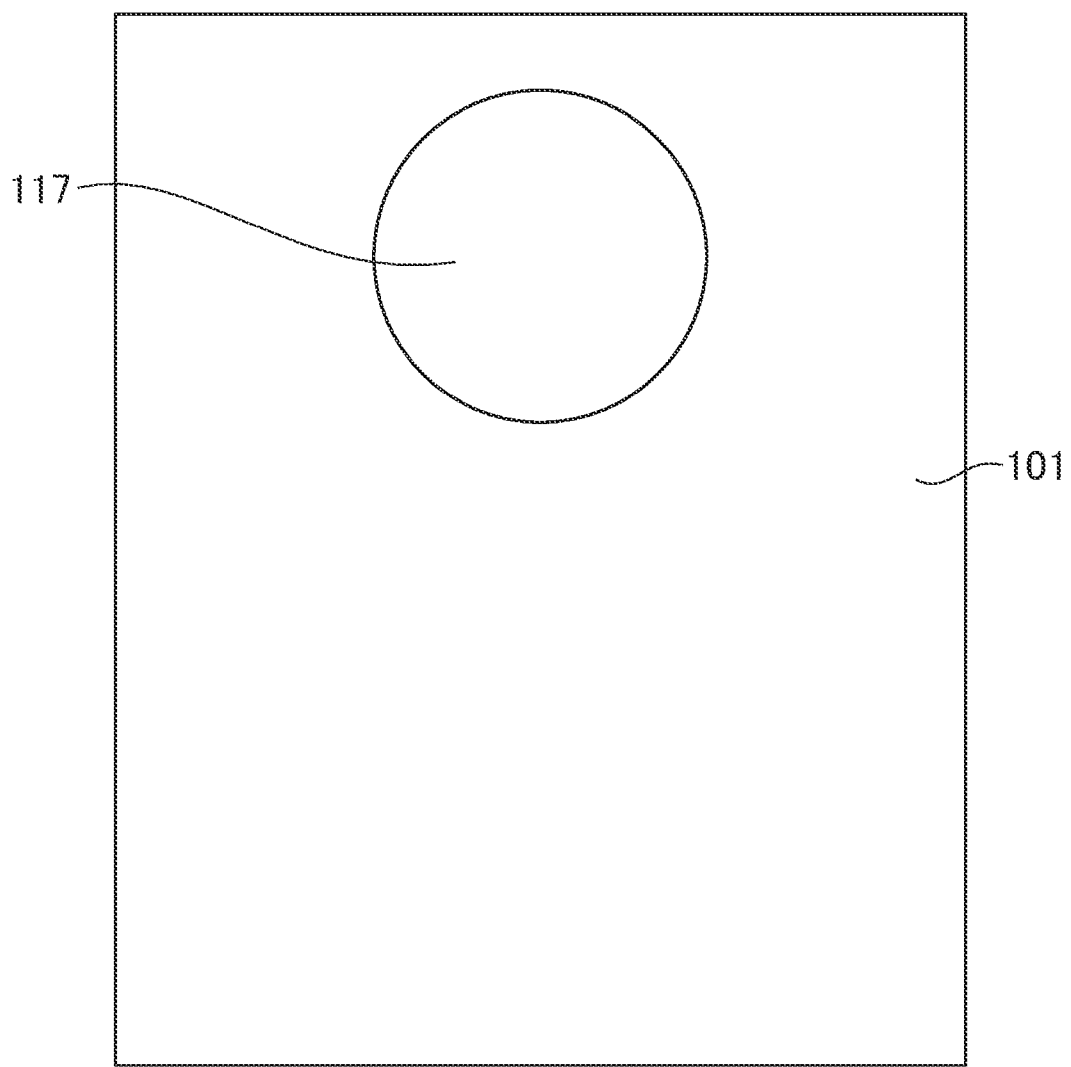
FIG. 3B is a bottom view of the semiconductor optical device according to the second embodiment of the present invention.
Figure 3C:
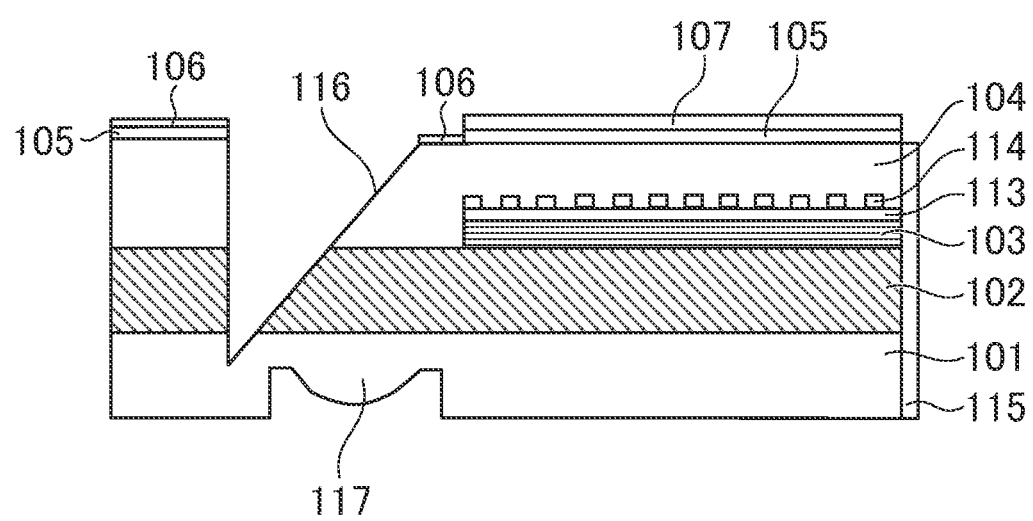
FIG. 3C is a sectional view of the semiconductor optical device according to the second embodiment of the present invention.

FIG. 3A is a plan view (diagram of an upper surface) of a semiconductor optical device according to a second embodiment of the present invention. FIG. 3B is a bottom view (diagram of a lower surface) of the semiconductor optical device according to the second embodiment of the present invention. FIG. 3C is a sectional view of the semiconductor optical device according to the second embodiment of the present invention and illustrates a section when taken along the line IIIC-IIIC of FIG. 3A. The semiconductor optical device according to the embodiment is a surface emission semiconductor laser (LIESEL: Lens Integrated Surface Emitting Laser) having the wavelength band of 1.3 μm. Here, the LISEL is the semiconductor optical device in which a semiconductor laser, a mirror, and a lens are integrated and a general structure of the LISEL is disclosed in JP 2008-277445 A. The semiconductor laser provided in the LISEL has, for example, the same structure as that of the conventional DFB laser. The semiconductor optical device according to second the embodiment is used as the LISEL to thereby implement improvement of coupling efficiency and miniaturization of the optical module.

The laser part of the semiconductor optical device according to the second embodiment is a DFB laser and has the same structure as that of the semiconductor optical device according to the first embodiment. The resonator length (length along the extending direction of the ridge) is 150 μm similarly to the first embodiment. The section taken along the line IB-IB of FIG. 3A is the same as FIG. 1B which is the sectional view of the semiconductor optical device according to the first embodiment.

In the semiconductor optical device according to the second embodiment, the semiconductor optical device according to the first embodiment, a mirror structure 116 reflecting light emitted from the light emitting part 110 toward the rear surface, and a lens 117 condensing light reflected by the mirror structure 116 are monolithically integrated.

The semiconductor layer located on the surface of the conductor layer (p-side electrode 107 and n-side electrode 108) side of the semiconductor optical device is removed and a surface obliquely intersecting with the emission direction of light emitted by the laser part is formed. The formed surface corresponds to the mirror structure 116 illustrated in FIG. 3A. The semiconductor layer (semi-insulating InP) located on the rear surface (surface of semi-insulating InP substrate 101 side) of the semiconductor optical device is removed and a convex surface is formed. The lens 117 illustrated in FIG. 3B is configured by the formed surface. In FIG. 3A, an area having the lens 117 formed on the rear surface thereof is illustrated when viewed from top.

Here, the normal line of the reflection surface of the mirror structure 116 intersects with the light emission direction of light of the laser part at 45°, and light reflected by the mirror structure 116 travels to the thickness direction (stacking direction), condensed by the lens 117, and emitted toward the direction perpendicular to the rear surface of the semi-insulating InP substrate 101. The angle at which the normal line of the reflection surface of the mirror structure 116 intersects with the light emission direction of light of the laser part is not limited to 45° but may include any angle as long as the reflected light reaches the rear surface of the semi-insulating InP substrate 101. The lens 117 is a convex lens and light emitted from the rear surface of the semiconductor optical device is desirably convergence light, but is not limited thereto. The light emitted from the rear surface may also be parallel light and divergence light of which divergence is more suppressed than the light emitted from the laser part. A high reflection dielectric film 115 is arranged on the rear end surface of the semiconductor optical device. In FIG. 3C, the diffraction grating of the p-type InGaAsP diffraction grating layer 114 is illustrated and thus, the p-type InP spacer layer 113 is distinguished from the p-type InP layer 104.

Similar to the first embodiment, in the second embodiment, the separation groove 109 is arranged to surround the p-type electrode formation part 111 (pad part of p-side electrode 107). With this, as in the second embodiment, even in a case where the mirror structure 116 is integrated in the light emission direction side, the separation groove 109 is able to electrically separate the n-type InP layer 102 located in the p-type electrode formation part 111 from the remaining portion without interfering with the mirror structure 116, and exhibits a remarkable effect.

In the following, description will be made on a manufacturing method of the semiconductor optical device according to the second embodiment. Some of processes for manufacturing the laser part of the semiconductor optical device are common to the manufacturing methods of the semiconductor optical device according to the first embodiment and the second embodiment. The processes up to the process of forming a diffraction grating having uniform pitches along the extending direction (a direction penetrating a paper surface of FIG. 2A forwardly and rearwardly) of the ridge using the electron beam exposure method in the first embodiment are also the same in the second embodiment. In the second embodiment, thereafter, the p-type InGaAsP diffraction grating layer 114, the p-type InP spacer layer 113, and the InGaAlAs based active layer 103 located in an area which becomes the front side of the light emitting part 110, which includes an area at which the mirror is to be formed, are removed using the photolithography method and etching.

Subsequently, the wafer is introduced into a growth furnace again and the p-type InP layer 104 and the p-type InGaAs contact layer 105 are stacked on the entire surface of the wafer. Through the processes described above, only the p-type InP layer 104 and the p-type InGaAs contact layer 105 are grown in the semiconductor layer of the portion where the mirror is to be formed. Subsequently, on the wafer, the $SiO_2$ film (silicon dioxide film) is covered to be a predetermined shape and the protective mask is formed. Thereafter, similar to the first embodied example, a portion of the p-type InP layer 104 and the p-type InGaAs contact layer 105 is removed using the $SiO_2$ protective mask and the ridge and the banks are formed. Thereafter, the $SiO_2$ film used as the protective mask is removed.

Next, the p-type InGaAs contact layer 105 of the area in which the mirror structure 116 is formed is removed by the photolithography method and etching. Subsequently, the SiO$_2$ film is formed on the entire surface of the wafer. Thereafter, the SiO$_2$ film located on the area where the mirror is to be formed is removed by the photolithography method and etching and semiconductor (p-type InP) is removed by etching to thereby form an inclined surface (mirror structure 116). The etching is a chemically assisted ion beam etching (CAIBE) using chlorine gas and argon gas and is able to be performed on the wafer in a state of being inclined at an inclination angle of 45°. The etching is not limited thereto, but may include, for example, a reactive ion beam etching (RIBE) with chlorine based gas or a wet etching.

In a surface newly formed by removing semiconductor located on the surface of the wafer, a cut out surface of one side of the surface is defined as an inclined surface of an inclination angle of 45° and a cut out surface of the other side of the surface is defined as a surface enlarging in the thickness direction (a right angled triangle with side surfaces enlarging in the thickness direction), but the surface is not limited thereto. The sections of both sides are defined as the inclined surfaces having the inclination angle of 45° (a right-angled isosceles triangle with side surfaces enlarging in the thickness direction). In this case, the section becomes a V-shaped section. As described above, the inclination angle is not limited to 45° but may include any angle other than 45°.

Next, similar to the first embodiment, the SiO$_2$ protection film 106 arranged on the upper surface of the ridge and the SiO$_2$ protection film 106 arranged on the area where the n-side electrode 108 contacts the n-type InP layer 102 are removed.

The p-side electrode 107 and the n-side electrode 108 are deposited to be a predetermined shape, respectively. Thereafter, the rear surface of the wafer is polished until the thickness of the rear surface reaches 150 μm and then, a silicon nitride (SiN) mask is formed on the rear surface of the wafer. Subsequently, semiconductor is etched to be a ring column having a diameter of 125 μm and a depth of 30 μm by the reactive ion etching using mixed gas of methane and hydrogen. Here, a remaining portion after removal through etching is a column (inside of the ring). Here, the remaining portion is a column, but may be an elliptical column according to the purpose of use.

Subsequently, the SiN mask of the upper portion of the remaining column portion is removed, an angle etched from the surface of the column portion by the wet etching is rounded, and a convex surface is formed. The convex surface corresponds to the lens 117 which is a monolithically integrated lens formed in the rear surface of the semi-insulating InP substrate 101. Through subsequent processes, the antireflective film (not illustrated) is formed on the surface of the lens 117.

In the embodiment, the resonator length of the laser part is 150 μm and a coupling coefficient of the diffraction grating is 200 cm$^{-1}$, but is not limited thereto, and other values may be used. An entire length in the extending direction of the ridge of the semiconductor optical device is set as 400 μm. The pitch of the diffraction grating of the p-type InGaAsP diffraction grating layer 114 is designed to be oscillated at the wavelength of 1.31 μm uniformly in the wafer. Similar to the first embodiment, the diffraction grating may have a phase shift structure or a structure (structure in which diffraction gratings are arranged at a plurality of pitch lengths) in which a period of the diffraction grating is changed.

The subsequent processes are the same as those of the manufacturing method according to the first embodiment. As illustrated in FIG. 3C, the high reflection dielectric film 115 is formed on the rear end surface. However, the anti-reflection dielectric film to be formed in the front end surface in the first embodiment is unnecessary. In this manner, the semiconductor optical device according to the embodiment is manufactured. Similar to the first embodiment, the semiconductor optical device according to the second embodiment is mounted on the sub-mount by junction-downing scheme. The semiconductor optical device according to the second embodiment is able to be stably mounted similar to the semiconductor optical device according to the first embodiment.

The direct current characteristic of the semiconductor optical device according to the embodiment is evaluated. The oscillation threshold current is 5 mA and the slope efficiency is 0.35 W/A at room temperature and a good oscillation characteristic are obtained. The good single wavelength oscillation is implemented at a wavelength of 1.3 μm. Degradation of the oscillation characteristic due to integration of functional units such as the mirror structure 116 or the lens 117 as well as degradation of the oscillation characteristic due to provision of the separation groove 109 are also significantly suppressed. When the capacitance of a device of the semiconductor optical device is measured, it is found out that a value in the order of 1.0 pF is able to be obtained, the decrease of capacitance is implemented, and the semiconductor optical device according to the embodiment achieves additional effect.

In the far field pattern (FFP) of emitted light of the semiconductor optical device, deviation in a plane parallel to the rear surface is also approximately 3° at a full width at half maximum and a significantly narrow FFP is obtained by the lens 117. An experiment for direct optical coupling of the semiconductor optical device and the single mode fiber (SMF) is conducted, however, a satisfactory optical coupling having coupling loss of approximately −3 dB is able to be obtained. When a coupling efficiency of −1 dB is degraded, the position deviation amount is approximately 10 μm. Accordingly, in the semiconductor optical device according to the second embodiment, functional units such as the mirror structure or the lens are integrated to thereby make it possible to reduce the number of components and achieve simple mounting.

Next, the high frequency characteristic of the semiconductor optical device according to the second embodiment is measured. A wide band obtained by reflecting a modulation band of 25 GHz at the 40 mA bias current of a low current at room temperature and a low capacitance structure may be obtained. As described above, in the second embodiment, it is possible to manufacture a high-speed device suitable as the next generation fast response light source with good yield in response to the decrease of capacitance and simple mounting.

Third Embodiment

Figure 4A:
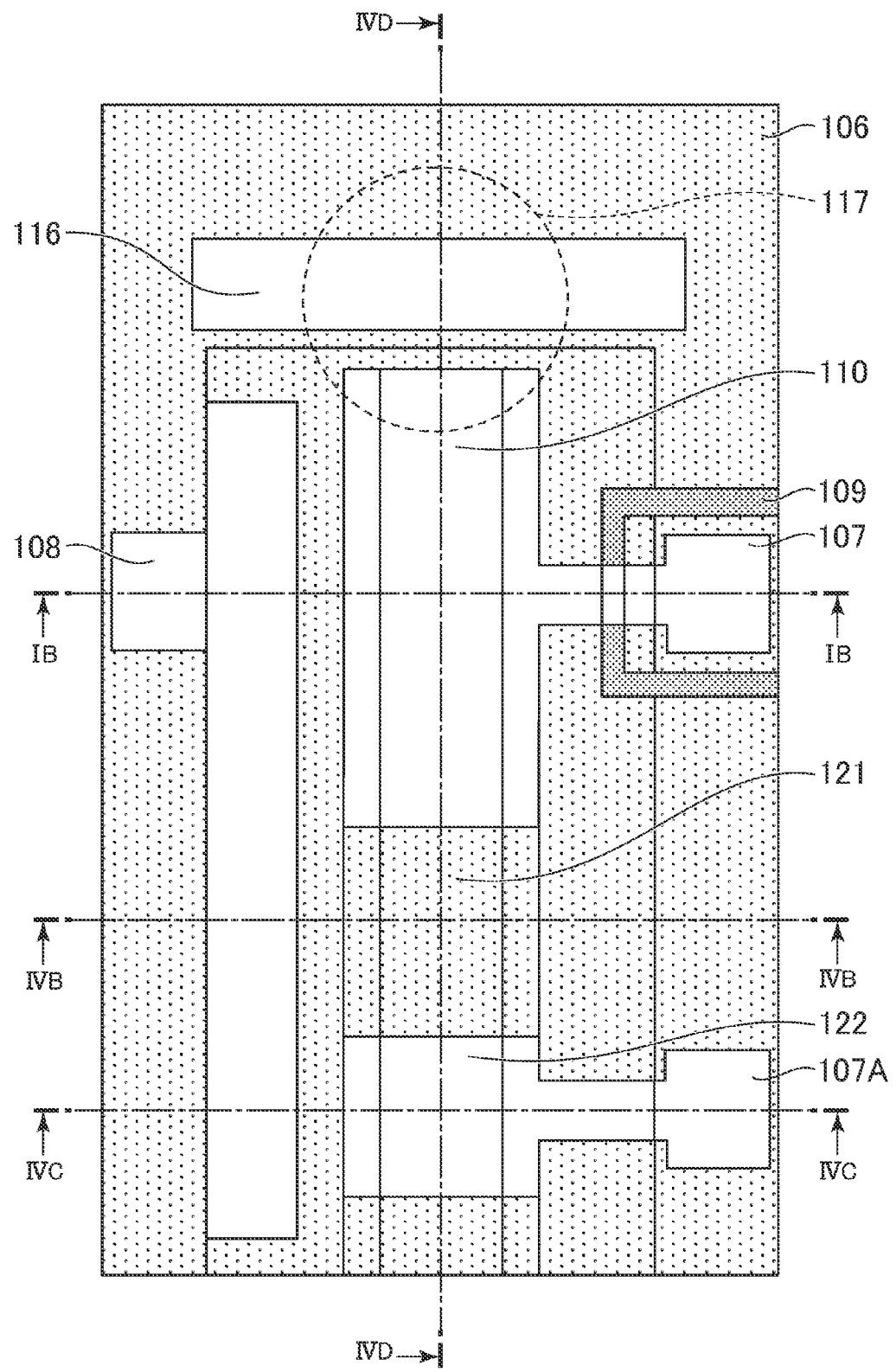
FIG. 4A is a plan view of a semiconductor optical device according to a third embodiment of the present invention.
Figure 4B:
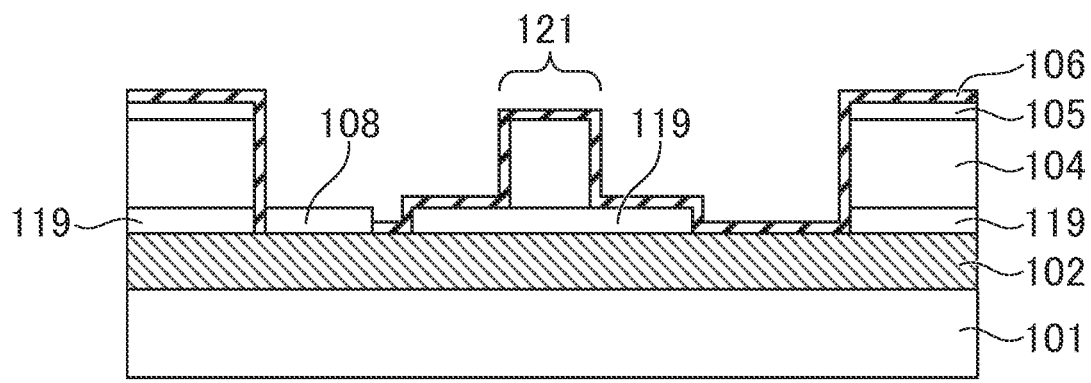
FIG. 4B is a sectional view of the semiconductor optical device according to the third embodiment of the present invention.
Figure 4C:
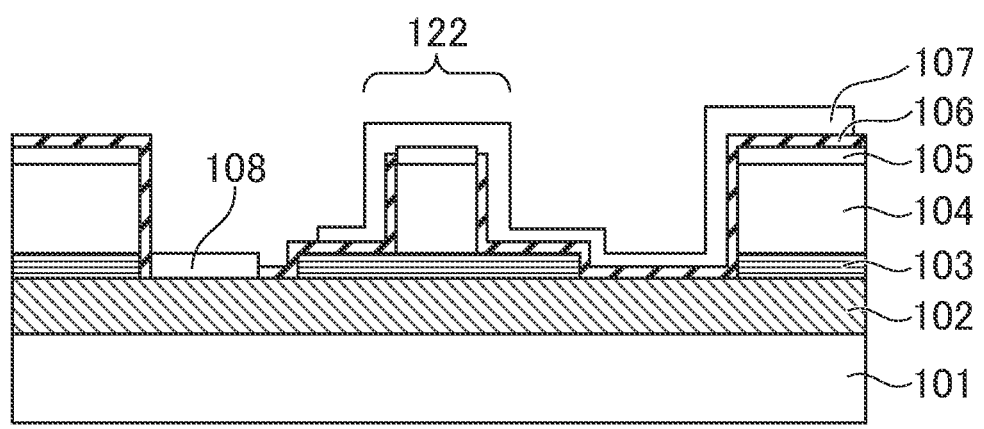
FIG. 4C is another sectional view of the semiconductor optical device according to the third embodiment of the present invention.
Figure 4D:
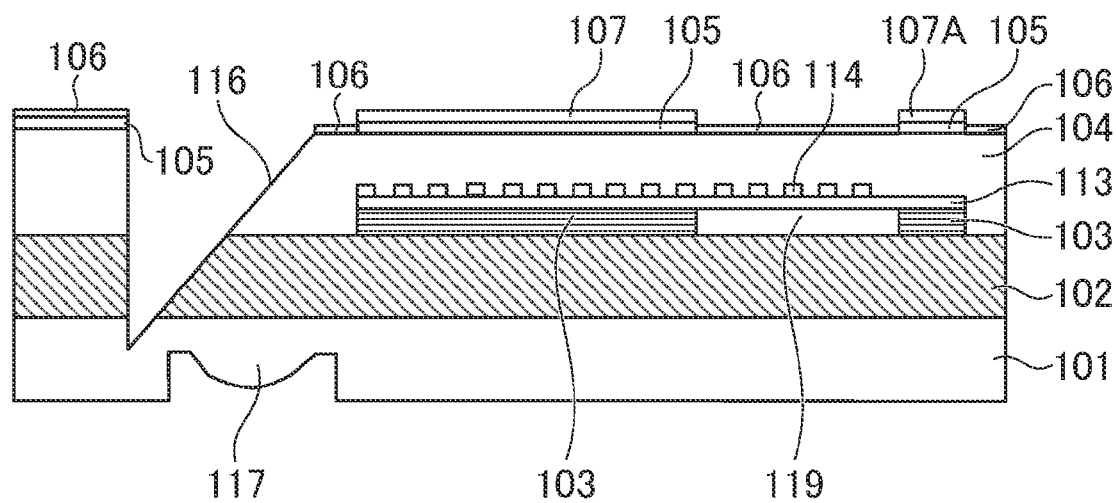
FIG. 4D is another sectional view of the semiconductor optical device according to the third embodiment of the present invention.

FIG. 4A is a plan view (diagram of an upper surface) of a semiconductor optical device according to a third embodiment of the present invention. FIG. 4B to FIG. 4D are sectional views of the semiconductor optical device according to the third embodiment of the present invention, and illustrate sections when taken along the lines IVB-IVB, IVC-IVC, and IVD-IVD illustrated in FIG. 3A, respectively. The semiconductor optical device according to the third embodiment has the same structure as that of the semiconductor optical device according to the second embodiment except that the structure of the laser part is a distributed reflector (DR) Laser (distribution reflector type laser) and a monitor photo detector (PD) is further included in the rear side of the laser part.

As illustrated in FIG. 4A, in the laser part of the semiconductor optical device according to the third embodiment, the light emitting part 110 which becomes a DFB laser area, a rear distributed Bragg reflector (DBR) mirror part 121 (rear DBR mirror area) arranged to be connected to the light emitting part 110 in the rear side, and a monitor PD part 122 located on a rear side further than the rear DBR mirror part 121 are monolithically integrated. That is, the light emitting structure includes the DFB laser area and the rear DBR mirror area. The light emitting part 110 which becomes the DFB laser area, the rear DBR mirror part 121, and the monitor PD part 122 are subjected to Butt-joint (BJ) integration by adjusting the optical axis. An area between the monitor PD part 122 and the rear end surface is formed in a window structure. That is, in the semiconductor optical device according to the third embodiment, the light emitting structure further includes the distribution Bragg reflection mirror and is configured as the distributed reflector type laser.

The structure of the DFB laser area of the semiconductor optical device according to the third embodiment has the same structure as that of the light emitting part 110 of the semiconductor optical device according to the first embodiment. The section taken along the line of IB-IB illustrated in FIG. 4A is the same as FIG. 1B which is the sectional view of the semiconductor optical device according to the first embodiment.

As illustrated in FIG. 4B, an undoped InGaAsP optical waveguide layer 119 is arranged on the upper side of the n-type InP layer 102 in the rear DBR mirror part 121 differently from the light emitting part 110. The p-type etching stop layer, the p-type InP spacer layer 113, and the p-type InGaAsP diffraction grating layer 114 which are not illustrated are formed on the upper side of the undoped InGaAsP optical waveguide layer 119. In FIG. 4B, only the p-type InP layer 104 is illustrated and the p-type InP spacer layer 113 is included in the p-type InP layer 104. The p-type InGaAs contact layer 105 stacked on the upper side of the p-type InP layer 104 is removed and the SiO$_2$ protection film 106 is formed on the upper side of the p-type InP layer 104 in the ridge of the rear DBR mirror part 121.

As illustrated in FIG. 4C, the monitor PD part 122 (monitor PD area) has the same structure as that of the light emitting part 110 of the DFB laser area except that the separation groove 109 is not formed and the n-side electrodes 108 are not formed on the banks, respectively. The semiconductor layer which is the same as the InGaAlAs based active layer 103 of the light emitting part 110 is used in an absorption layer of the monitor PD part 122. The p-side electrode 107A of the monitor PD part 122 contacts the upper surface of the ridge and reaches the upper end of the p-type electrode formation part, similar to the p-side electrode 107 of the light emitting part 110 of the DFB laser area. As described above, the p-type InGaAs contact layer 105 is not formed on the upper surface of the ridge of the rear DBR mirror part 121. Accordingly, the p-side electrode 107 of the light emitting part 110 and the p-side electrode 107A of the monitor PD part 122 are not electrically connected through the p-type InGaAs contact layer 105 but electrically connected through the p-type InP layer 104, and it may be regarded that the p-side electrode 107 and the p-side electrode 107A substantially electrically separated from each other.

The n-side electrode 108 is common to the light emitting part 110 of the DFB laser area and the monitor PD part 122. The n-side electrode 108 is formed on the bank of only the n-type electrode formation part 112 of the light emitting part 110 of the DFB laser area and the n-side electrode 108 is not formed on the bank of the monitor PD part 122. A portion where the n-side electrode 108 abuts the n-type InP layer 102 extends from the DFB laser area to the monitor PD part 122 in the flat area located between the ridge and the bank (n-side electrode 108 side).

As illustrated in FIG. 1B, FIG. 4B, and FIG. 4C, in the semiconductor optical device according to the embodiment, the ridge which continuously extends in the extending direction is formed and banks are formed on both sides of the ridge, respectively. In each area, the ridge and the banks of both sides have the same semiconductor structure. As a result, a height difference between the p-type electrode formation part 111 and the n-type electrode formation part 112 of the light emitting part 110 of the DFB laser area and the p-type electrode formation part of the monitor PD part 122 is reduced and the respective upper surfaces are located at substantially the same plane. Accordingly, stable mounting may be implemented.

Similar to the first and second embodiments, in the third embodiment, the separation groove 109 is arranged to surround the p-type electrode formation part 111 (pad part of p-side electrode 107). With this, as in the third embodiment, the mirror structure 116 may be integrated on the front side of the DFB laser area and the rear DBR mirror part 121 or the monitor PD part 122 may be integrated on the rear side of the DFB laser area and an additional effect may be achieved.

In the following, descriptions will be made on the manufacturing method of the semiconductor optical device according to the third embodiment. The manufacturing process of the laser part of the manufacturing method of the semiconductor optical device according to the embodiment is different from the manufacturing method of the semiconductor optical device according to the second embodiment, but other processes are the same as those of the manufacturing method of the semiconductor optical device according to the second embodiment.

On the wafer, the n-type InP layer 102, the InGaAlAs based active layer 103, the p-type etching stop layer (not illustrated), the p-type InP spacer layer 113, and the p-type InGaAsP diffraction grating layer 114 are sequentially epitaxially grown using the metal organic vapor phase growth method or the like (FIG. 2A).

The semiconductor layer located on the area where the rear DBR mirror part 121 is formed is removed up to the InGaAlAs based active layer 103 by etching. In this case, the semiconductor layer located on the area where the monitor PD part 122 is formed remains without being removed. In this process, the semiconductor layer located on an area (including an area where the mirror structure 116 is formed) which becomes a front portion of the laser part and an area which becomes a rear portion of the monitor PD part 122 are removed together.

Subsequently, the undoped InGaAsP optical waveguide layer 119, the p-type etching stop layer (not illustrated), the p-type InP spacer layer 113, and the p-type InGaAsP diffraction grating layer 114 are sequentially epitaxially grown in the area where the rear DBR mirror part 121 is formed by being subjected to a butt joint growth. Here, the heights or epitaxial growth conditions of the InGaAlAs based active layer 103 and the undoped InGaAsP optical waveguide layer 119 are adjusted such that the p-type InP spacer layer 113 and the p-type InGaAsP diffraction grating layer 114 are connected from the light emitting part 110 of the DFB laser area to the rear DBR mirror part 121.

Thereafter, the p-type InGaAsP diffraction grating layer 114 is formed on a portion spanning from the light emitting part 110 of the DFB laser area to the rear DBR mirror part 121. In this case, the p-type InGaAsP diffraction grating layer 114 of the monitor PD part 122 is removed. As illustrated in FIG. 4D, the p-type InGaAsP diffraction grating layer 114 is formed on a portion spanning from the DFB laser area to the rear DBR mirror part 121, but is not formed on the monitor PD part 122. In order to more clarify the structure, in FIG. 4D, the p-type InP spacer layer 113 is illustrated to be distinguished from the p-type InP layer 104.

The p-type InP layer 104 is stacked on the wafer. The area between the monitor PD part 122 and the rear end surface are buried in the p-type InP layer 104 to thereby form a window structure. The p-type InP layer 104 is stacked on the area which becomes the front portion of the laser part. The subsequent processes are the same as those of the semiconductor optical device according to the second embodiment.

The rear surface of the wafer is polished until the thickness of the rear surface reaches 150 μm similar to the second embodiment. In the semiconductor optical device of the third embodiment, the rear DBR mirror part 121 and the monitor PD part 122 are integrated on the rear part of the DFB laser area and coating of the rear end surface with the antireflection dielectric film is unnecessary. In the semiconductor optical device according to the third embodiment, stable mounting may be implemented similar to the semiconductor optical device according to the first and second embodiments.

In the third embodiment, for example, the resonator length of the light emitting part 110 of the DFB laser area is set as 100 μm, the coupling coefficient of the diffraction grating is set as 200 cm$^{-1}$, and the length of the monitor PD part 122 is set as 30 μm, but the values are not limited thereto and other values may be used. An entire length in the extending direction of the ridge of the semiconductor optical device is set as 600 μm. The pitch of the diffraction grating of the p-type InGaAsP diffraction grating layer 114 is designed to be oscillated at the wavelength of 1.31 μm uniformly in the wafer. The diffraction grating structure is the same as those of the first and the second embodiment but is not limited thereto.

The direct current characteristic of the semiconductor optical device according to the third embodiment is evaluated. The oscillation threshold current is 4 mA and the slope efficiency is 0.4 W/A at room temperature and a good oscillation characteristic reflecting a short resonator structure is obtained. The good single wavelength oscillation is implemented at a wavelength of 1.3 μm. Similar to the second embodiment, degradation of the oscillation characteristic due to integration of functional units as well as degradation of the oscillation characteristic due to provision of the separation groove 109 are significantly suppressed. When the capacitance of a device of the semiconductor optical device is measured, it is found out that a value in the order of 1.0 pF is obtained, the decrease of capacitance is implemented, and the semiconductor optical device according to the third embodiment achieves the additional effect.

Also, regarding the far field pattern (FFP) of emitted light of the semiconductor optical device, it is possible to reduce the number of components and achieve simple mounting similar to the second embodiment.

Next, the high frequency characteristic of the semiconductor optical device according to the third embodiment is measured. A wide band obtained by reflecting a modulation band of 30 GHz at the 40 mA bias current of a low current at room temperature, the short resonator structure, and a low capacity structure may be obtained. As described above, in the third embodiment, it is possible to manufacture a high-speed device suitable as the next generation fast response light source with good yield in response to the decrease of capacitance and simple mounting.

The laser part of the semiconductor optical device according to the first to third embodiments is the DBR laser or the DR laser, but is not limited thereto, and may include other semiconductor lasers such as the DBR laser. In the DBR laser (distributed Bragg reflection type laser), the light emitting structure further includes the distributed Bragg reflection mirror.

Fourth Embodiment

Figure 5A:
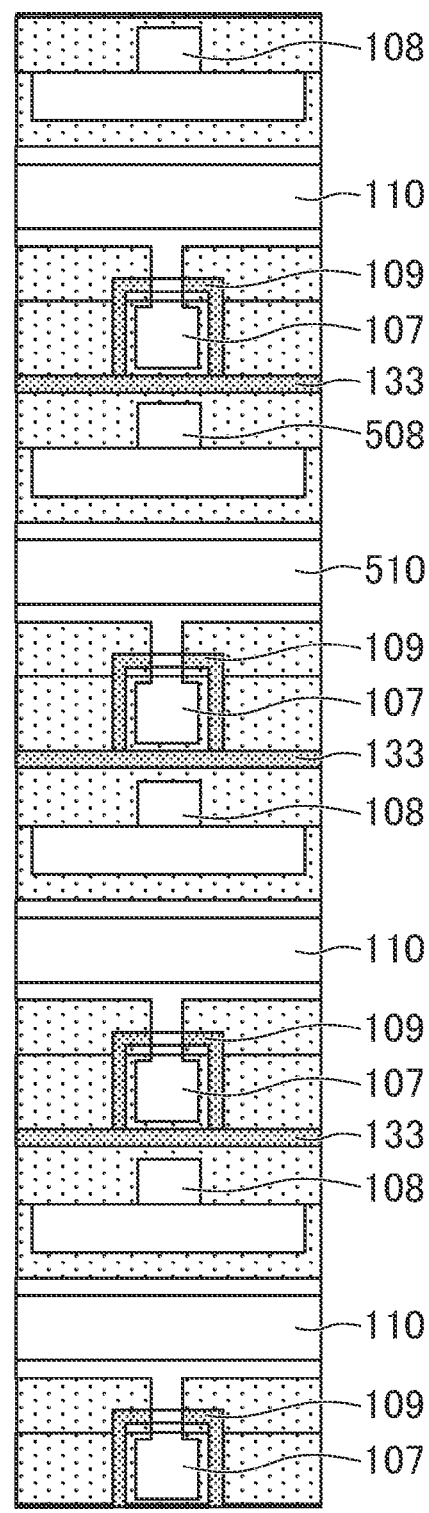
FIG. 5A is a plan view of an arrayed semiconductor optical device according to a fourth embodiment of the present invention.
Figure 5B:
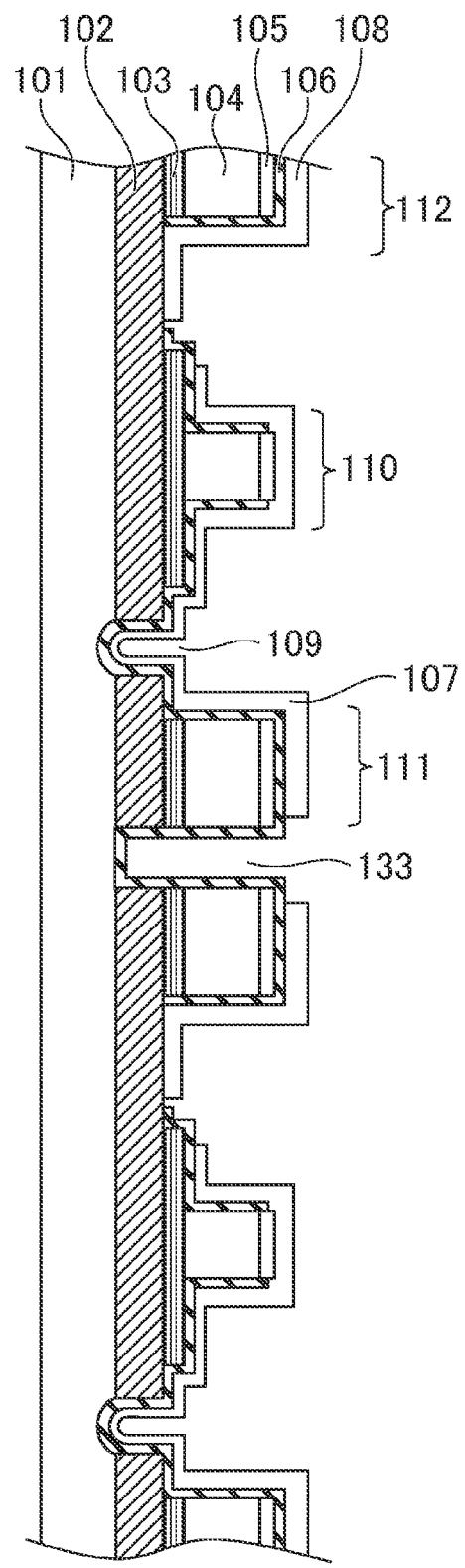
FIG. 5B is a sectional view of the arrayed semiconductor optical device according to the fourth embodiment of the present invention.

FIG. 5A is a plan view of an arrayed semiconductor optical device according to a fourth embodiment of the present invention. FIG. 5B is a sectional view of the arrayed semiconductor optical device according to the fourth embodiment of the present invention. The arrayed semiconductor optical device according to the embodiment is an arrayed semiconductor optical device in which a plurality of semiconductor optical devices according to the first embodiment are monolithically integrated at predetermined intervals and is an arrayed ridge waveguide type DFB laser. Here, the arrayed semiconductor optical device is a 4-channel DFB laser array. Each channel of the arrayed semiconductor optical device according to the fourth embodiment has the same structure as that of the semiconductor optical device according to the first embodiment. The ridges of the plurality of semiconductor optical devices of the arrayed semiconductor optical device according to the fourth embodiment are arranged at predetermined intervals and light is emitted out from the light emitting part 110 of each semiconductor optical device (each channel). Accordingly, light is emitted out from the plurality of semiconductor optical devices of the arrayed semiconductor optical device according to the fourth embodiment at predetermined intervals.

In FIG. 5A, the 4-channel semiconductor optical device is illustrated in the up/down direction and in FIG. 5B, similar to FIG. 1B, the section penetrating the p-type electrode formation part 111 from the n-type electrode formation part 112 in a plane perpendicular to the extending direction is illustrated. Inter-channel separation grooves 133 (second grooves) are formed between adjacent semiconductor optical devices and in a case of the 4-channel laser array, three inter-channel separation grooves 133 are arranged. The inter-channel separation grooves 133 are formed along the extending direction of the ridge extending from the front end surface to the rear end surface, and the semiconductor layer existing on the area where the inter-channel separation grooves 133 located when viewed from top is removed up to the n-type InP layer 102 and the semi-insulating InP substrate 101 is exposed. The adjacent semiconductor optical devices are electrically separated from each other by the inter-channel separation groove 133. The resonator length of the semiconductor optical device of each channel is 150 μm. The SiO$_2$ protection film 106 is formed on the surfaces (bottom surface and side surface of the groove) of the area on which the inter-channel separation groove 133 is formed.

In order to clarify an area where the inter-channel separation groove 133 is formed, half-tone dot meshing is applied to the area similar to the separation groove 109.

Both ends of the separation groove 109 formed on one (upper side of FIG. 5A) of the adjacent semiconductor optical devices are formed to be opened to the inter-channel separation groove 133 and formed to implement a high design degree of freedom, but is not limited thereto. At least one end of the separation groove 109 may be formed to be opened to the inter-channel separation groove 133. A high design degree of freedom is implemented in a side opened to the inter-channel separation groove 133.

The manufacturing method of the arrayed semiconductor optical device according to the fourth embodiment is the same as those of the manufacturing method of the semiconductor optical device according to the first embodiment except for the following matters. The manufacturing method of the arrayed semiconductor optical device according to the embodiment further includes the process of etching the n-type InP layer 102 between channels by the photolithography method and the wet etching to form the inter-channel separation groove 133 before the process of forming the $SiO_2$ protection film 106. Thereafter, the $SiO_2$ protection film 106 is formed on the entire surface of the wafer, the $SiO_2$ protection film 106 is formed and thus, the $SiO_2$ protection film 106 is also formed on the bottom surface and the side surface of the inter-channel separation groove 133. Also, a process of cleaving the chip is also different from the manufacturing method of the semiconductor optical device according to the first embodiment.

In the arrayed semiconductor optical device according to the fourth embodiment, stable mounting may be implemented similar to the semiconductor optical device according to the first, second, and third embodiments. Although the oscillation characteristic of the arrayed semiconductor optical device according to the fourth embodiment is evaluated, the same evaluation result as the oscillation characteristic of the semiconductor optical device according to the first embodiment is obtained. Accordingly, also in the fourth embodiment, it is found out that degradation of the oscillation characteristic due to provision of the separation groove 109 or the inter-channel separation groove 133 is significantly suppressed and an influence due to integration of the plurality of semiconductor optical devices is extremely limited. It is found out that a low value of 0.5 pF is able to be obtained in the capacitance of the device of each semiconductor optical device (each channel) and decrease of capacitance is implemented also in the arrayed semiconductor optical device. As described above, in the fourth embodiment, it is possible to manufacture a high-speed device suitable as the next generation fast response light source with good yield in response to the decrease of capacitance and simple mounting. For example, in the multichannel scheme, the fourth embodiment is most suitable for the arrayed semiconductor optical device of which a speed per channel is driven faster than conventional 10 Gbps.

Fifth Embodiment

Figure 6:
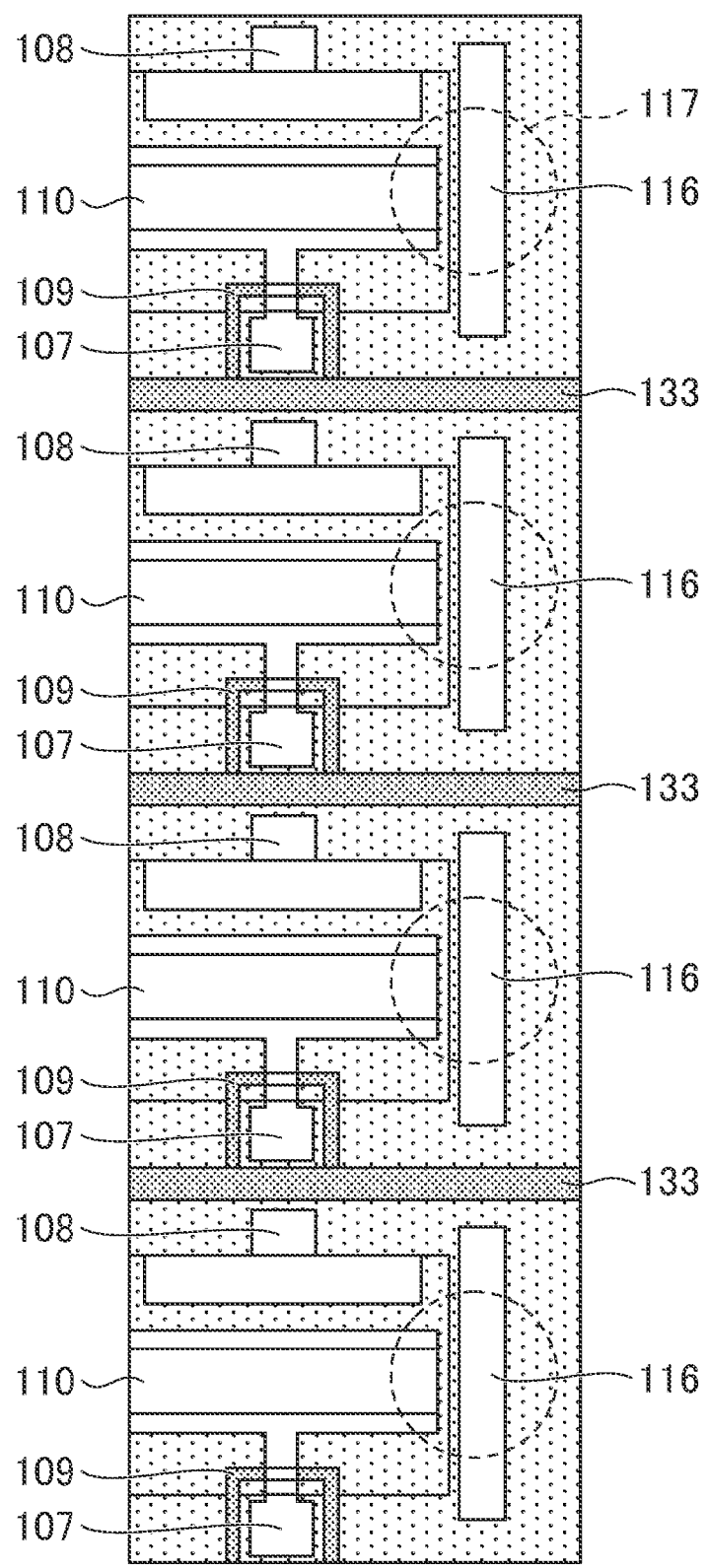
FIG. 6 is a plan view of an arrayed semiconductor optical device according to a fifth embodiment of the present invention.

FIG. 6 is a plan view of an arrayed semiconductor optical device according to a fifth embodiment of the present invention. The arrayed semiconductor optical device according to the fifth embodiment is an arrayed semiconductor optical device in which a plurality of semiconductor optical devices according to the second embodiment are monolithically integrated at predetermined intervals and is an array type LISEL. Here, the arrayed semiconductor optical device is a 4-channel LISEL array. Each channel of the arrayed semiconductor optical device according to the fifth embodiment has the same structure as that of the semiconductor optical device according to the second embodiment. In the arrayed semiconductor optical device according to the fifth embodiment, the inter-channel separation groove 133 is formed similar to the fourth embodiment.

The ridges of the plurality of semiconductor optical devices of the arrayed semiconductor optical device according to the fifth embodiment are arranged at predetermined intervals and the lenses 117 arranged on the rear surface are also arranged at predetermined intervals. Accordingly, light is emitted out from the rear surface of the arrayed semiconductor optical device according to the fifth embodiment at predetermined intervals.

In the arrayed semiconductor optical device according to the fifth embodiment, stable mounting may be implemented similar to the arrayed semiconductor optical device according to the fourth embodiment. Although the oscillation characteristic of the arrayed semiconductor optical device according to the fifth embodiment is evaluated, the same evaluation result as the oscillation characteristic of the semiconductor optical device according to the second embodiment is obtained. Furthermore, it is found out that in a case where all semiconductor optical devices (all channels) are driven simultaneously and in a case of being driven individually, a difference in a 25 Gb/s eye wavelength at 25° C. is extremely suppressed and an influence of cross talk between channels is extremely suppressed. Also, regarding the FFP or the optical coupling of emitted light, the same results as that of the semiconductor optical device according to the second embodiment are obtained.

As described above, in the fifth embodiment, it is possible to manufacture a high-speed device suitable as the next generation fast response light source with good yield in response to decrease of capacitance and simple mounting.

Sixth Embodiment

Figure 7A:
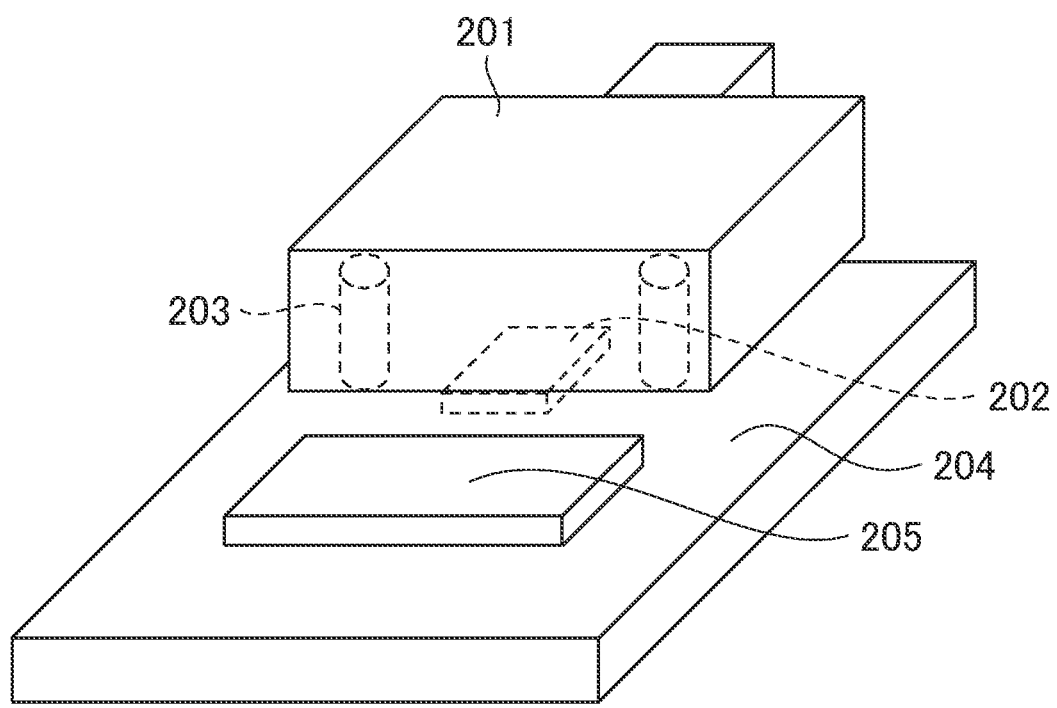
FIG. 7A is a perspective view of an optical module according to a sixth embodiment of the present invention.

FIG. 7A is a perspective view of an optical module according to a sixth embodiment of the present invention. FIG. 7B is a side view of the optical module according to the sixth embodiment of the present invention. The optical module according to the sixth embodiment includes an arrayed semiconductor optical device 202 according to the fourth embodiment, an integrated circuit 205 (drive circuit) for driving the arrayed semiconductor optical device 202, a plurality of optical fibers 206 (SMFs), a package for respectively fixing the arrayed semiconductor optical device 202, the integrated circuit 205, and the plurality of optical fibers 206 at predetermined positions. Here, the package is a fiber array connector 201 and a multilayer wiring ceramic substrate 204. The optical fiber 206 is an external waveguide for optically connecting to each of a plurality of semiconductor optical devices provided in the arrayed semiconductor optical device 202.

On the multilayer wiring ceramic substrate 204, the arrayed semiconductor optical device 202 and the integrated circuit 205 are mounted while being electrically connected by a gold bump 208, and are respectively fixed at the predetermined positions. On the surface layer of the multilayer wiring ceramic substrate 204, a plurality of strip lines are formed and the integrated circuit 205 is electrically connected with each of the plurality of semiconductor optical devices (plurality of channels) of the arrayed semiconductor optical device 202. As described above, the height of the arrayed semiconductor optical device 202 is maintained to be substantially the same heights of the p-type electrode formation part 111 and the n-type electrode formation part 112 of each semiconductor optical device and thus, stable mounting is implemented.

Here, the plurality of (4 optical fibers) optical fibers 206 are bent at an angle of 90 degrees from the perpendicular direction to the horizontal direction and mounted on the fiber array connector 201. Light is emitted from the arrayed semiconductor optical device according to the fifth embodiment at the predetermined intervals and core layers of the plurality of optical fibers 206 are arranged at the predetermined intervals. The fiber array connector 201 is mounted on a position by a connector support post 203 where each semiconductor optical device (each channel) of the arrayed semiconductor optical device 202 and each optical fiber 206 are optically coupled at there optimum level. The fiber array connector 201 is provided with a fitting hole 207 and the connector support post 203 is inserted to be fit in the fitting hole 207 and fixed by adhesive after being aligned on the optimum position.

In the arrayed semiconductor optical device 202, the low capacitance structure is implemented and the mirror structure 116 and the lens 117 are integrated and thus, high-efficiency optical coupling with the optical fiber 206 is possible. The optical fiber 206 is bent at an angle of 90 degrees and mounted on the fiber array connector 201 such that the optical fiber 206 is able to be easily mounted on the position where the optimum optical coupling is implemented between the light receiving surface of the optical fiber 206 and the light emitting surface of the arrayed semiconductor optical device 202.

Miniaturization is implemented in the optical module according to the sixth embodiment. Regarding the optical module according to the sixth embodiment, a transmission experiment at 25 Gb/s per channel is conducted. By reflect the low capacity structure and the high efficiency optical coupling, the sufficient optical output and error free operation are implemented at the 2 km distance. According to the embodiment, it is possible to manufacture a small and low cost multichannel optical module suitable for use in a router apparatus.

The optical module according to the sixth embodiment includes the arrayed semiconductor optical device according to the fifth embodiment, but it is needless to say that the invention is not limited thereto. The optical module according to the sixth embodiment may include the arrayed semiconductor optical device according to the fourth embodiment and also include other arrayed semiconductor optical devices according to the present invention. The arrayed semiconductor optical device according to the embodiment includes the plurality of semiconductor optical devices (channels), but is not limited thereto, and the optical module may include the semiconductor optical device (1-channel semiconductor optical device). The arrayed semiconductor optical device according to the sixth embodiment may be the semiconductor optical device according to any of the first to third embodiments and otherwise, may be other arrayed semiconductor optical devices according to the present invention. In this case, the optical module according to the present invention includes the semiconductor optical device according to the present invention, a drive circuit for driving the semiconductor optical device, an external waveguide optically connected with the semiconductor optical device, and a package for fixing the semiconductor optical device, the drive circuit, and the external waveguide at the predetermined positions, respectively.

The semiconductor optical device, the arrayed semiconductor optical device, and the optical module according to the embodiments of the present invention have been described. The present invention is not limited to the embodiments described above and is able to be widely applied to an electrode structure having a pad part. For example, the present invention may be applied to the semiconductor optical device for performing the optical communication of another wavelength band, for example, 1.5 μm and also to the semiconductor optical device intending to be used other than the optical communication.

While there have been described what are at present considered to be certain embodiments of the invention, it will be understood that various modifications may be made thereto, and it is intended that the appended claims cover all such modifications as fall within the true spirit and scope of the invention.

What is claimed is:

1. A semiconductor optical device comprising:
   a multilayer structure in which
      a semi-insulating substrate,
      a first semiconductor layer having one of p-type conductivity and n-type conductivity,
      an active layer having light emission function,
      a second semiconductor layer having conductivity opposite to that of the first semiconductor layer,
      an insulating layer, and
      an conductive layer are stacked in order from the bottom,
   wherein the multilayer structure includes a light emitting structure, a first electrode structure, and a second electrode structure,
   wherein in the semi-insulating substrate and the first semiconductor layer, a first groove, which separates the second electrode structure from a remaining portion and approaches the second electrode structure with a non-linear shape rather than a linear shape in its entirety, is formed,
   wherein the remaining portion of the first semiconductor layer separated by the first groove continues from the light emitting structure to the first electrode structure,
   wherein the active layer is formed on each of the light emitting structure, the first electrode structure, and the second electrode structure to be separated,
   wherein the second semiconductor layer is formed on each of the light emitting structure, the first electrode structure, and the second electrode to be separated,
   wherein the insulating layer is formed to cover the first semiconductor layer and expose a portion of the second semiconductor layer in the light emitting structure, cover the second semiconductor layer in the first electrode structure, cover the first semiconductor layer and the second semiconductor layer in the second electrode structure, and cover the first semiconductor layer in the inner surface of the first groove, and
   wherein the conductive layer includes a first wiring pattern contacting the first semiconductor layer and reaching the upper end of the first electrode structure and a second wiring pattern contacting the second semiconductor layer in the light emitting structure and reaching the upper end of the second electrode structure through above the insulating layer in the inner side of the first groove.

2. The semiconductor optical device according to claim 1, wherein the light emitting structure includes a ridge configured by a portion of the second semiconductor layer.

3. The semiconductor optical device according to claim 1, wherein the insulating layer is formed to expose a portion of the first semiconductor layer between the light emitting structure and the first electrode structure, and wherein the first wiring pattern contacts the first semiconductor layer to be electrically connected between the light emitting structure and the first electrode structure.

4. The semiconductor optical device according to claim 1, wherein the light emitting structure further includes a diffraction grating, and is configured as a distributed feedback laser.

5. The semiconductor optical device according to claim 1, wherein the light emitting structure further includes a distributed Bragg reflection mirror, and is configured as a distributed Bragg reflector type laser.

6. The semiconductor optical device according to claim 1, wherein the light emitting structure further includes a distributed feedback laser and a distributed Bragg reflection mirror, and is configured as a distributed reflector type laser.

7. The semiconductor optical device according to claim 1, wherein mirror structures in which light emitted from the light emitting structure is reflected toward a side opposite to the conductor layer are monolithically integrated.

8. The semiconductor optical device according to claim 1, wherein the semi-insulating substrate and the first semiconductor layer have a side surface enlarging in a thickness direction, and wherein at least one end of the first groove is formed to be opened to the side surface of the semi-insulating substrate and the first semiconductor layer.

9. An arrayed semiconductor optical device comprising: a plurality of semiconductor optical devices, wherein each of the plurality of semiconductor optical devices is the semiconductor optical device according to claim 1, wherein the plurality of semiconductor optical devices are monolithically integrated, and wherein a second groove separating adjacent semiconductor optical devices is formed in the semi-insulating substrate and the first semiconductor layer.

10. The arrayed semiconductor optical device according to claim 9, wherein at least one end of the first groove formed on one of the adjacent semiconductor optical devices is formed to be opened to the second groove.

11. An optical module comprising:
the semiconductor optical device according to claim 1;
a drive circuit for driving the semiconductor optical device;
an external waveguide optically connected to the semiconductor optical device; and
a package for fixing the semiconductor optical device, the drive circuit, and the external waveguide to predetermined positions, respectively.

12. An optical module comprising:
the arrayed semiconductor optical device according to claim 9;
a drive circuit for driving the plurality of semiconductor optical devices;
a plurality of external waveguides optically connected respectively to the plurality of semiconductor optical devices; and
a package for fixing the plurality of semiconductor optical devices, the drive circuit, and the plurality of external waveguides to predetermined positions, respectively.

13. A semiconductor optical device comprising:
a semiconductor substrate;
a light emitting structure provided on a surface of the semiconductor substrate, having a waveguide structure, and including a laser part and a distributed Bragg reflection mirror;
a monitor PD part arranged to be optically connected on the distributed Bragg reflection mirror side of the light emitting structure;
a window structure arranged on a side opposite to the distributed Bragg reflection mirror side of the monitor PD part; and
a mirror structure reflecting light emitted from a side opposite to the distributed Bragg reflection mirror side of the laser part to a rear surface of the semiconductor substrate.

* * * * *